(12) United States Patent
Koshihara et al.

(10) Patent No.: US 9,871,091 B2
(45) Date of Patent: Jan. 16, 2018

(54) ELECTRO-OPTICAL DEVICE AND ELECTRONIC APPARATUS

(71) Applicant: SEIKO EPSON CORPORATION, Tokyo (JP)

(72) Inventors: Takeshi Koshihara, Matsumoto (JP); Hitoshi Ota, Shiojiri (JP); Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/423,195

(22) Filed: Feb. 2, 2017

(65) Prior Publication Data

US 2017/0236891 A1    Aug. 17, 2017

(30) Foreign Application Priority Data

Feb. 15, 2016   (JP) .................................. 2016-026379

(51) Int. Cl.
*H01L 27/32*   (2006.01)

(52) U.S. Cl.
CPC ...... *H01L 27/3276* (2013.01); *H01L 27/3218* (2013.01); *H01L 27/3262* (2013.01)

(58) Field of Classification Search
CPC  H01L 27/3244; H01L 27/3248; H01L 27/326
See application file for complete search history.

(56) References Cited

U.S. PATENT DOCUMENTS

| 2003/0189410 | A1 | 10/2003 | Yamazaki et al. | |
| 2004/0130513 | A1 | 7/2004 | Miyazawa | |
| 2006/0170712 | A1* | 8/2006 | Miller | H01L 27/3218 345/695 |
| 2007/0229748 | A1* | 10/2007 | Fujita | G02F 1/133707 349/141 |
| 2007/0257946 | A1* | 11/2007 | Miller | G09G 3/2003 345/694 |
| 2008/0017860 | A1 | 1/2008 | Kubota et al. | |
| 2009/0289963 | A1* | 11/2009 | Minami | G09G 3/3233 345/690 |
| 2012/0293399 | A1* | 11/2012 | Haskin | G02F 1/134309 345/88 |

(Continued)

FOREIGN PATENT DOCUMENTS

| JP | 2004-004708 A | 1/2004 |
| JP | 2004-198493 A | 7/2004 |

(Continued)

*Primary Examiner* — Thao P Le
(74) *Attorney, Agent, or Firm* — Oliff PLC

(57) ABSTRACT

Subpixels of R, G, and B corresponding to a scanning line extended in a row direction and a data transfer line extended in a column direction are provided. A plurality of transistors in the subpixel of each of the colors is disposed along the column direction, and a reflective layer in the subpixel of at least one color is disposed along the row direction so as to overlap any transistor of subpixels of each display color. A power source wiring is disposed between the reflective layer and the transistor along the row direction, so as to overlap the transistor. Relay electrodes which connects the reflective layer and any transistor of subpixels of each display color are formed on a layer between a layer on which the power source wiring is formed, and the reflective layer.

20 Claims, 20 Drawing Sheets

(56) References Cited

U.S. PATENT DOCUMENTS

| | | |
|---|---|---|
| 2014/0267636 A1 | 9/2014 | Takagi et al. |
| 2015/0029208 A1* | 1/2015 | Kim .................... G09G 3/2003 |
| | | 345/590 |
| 2017/0236885 A1* | 8/2017 | Koshihara ........... H01L 27/3262 |
| 2017/0236891 A1* | 8/2017 | Koshihara ........... H01L 27/3276 |
| | | 257/72 |

FOREIGN PATENT DOCUMENTS

| | | |
|---|---|---|
| JP | 2007-226184 A | 9/2007 |
| JP | 2009-282190 A | 12/2009 |
| JP | 2013-211147 A | 10/2013 |
| JP | 2014-174429 A | 9/2014 |

\* cited by examiner

ELECTRO-OPTICAL DEVICE AND ELECTRONIC APPARATUS

BACKGROUND

1. Technical Field

The present disclosure relates to an electro-optical device and an electronic apparatus.

2. Related Art

Recently, an electro-optical device which uses an organic light emitting diode (OLED) as a light emitting element has been used in an electronic apparatus which can form a virtual image, such as a head mounted display. In such an electro-optical device, as disclosed in JP-A-2013-211147, a technology using a color filter is proposed as one of technologies which realize color display.

In this technology, emitted light beams of the red color, the greed color, and the blue color are obtained through color filters of three primary colors, that is, red, green, and blue, by using an OLED of emitting white light as a light source. A combination of an OLED and a filter for any color of the three primary colors is assumed to be a subpixel, and a combination of subpixels of the three primary colors is assumed to be a pixel. Such pixels are arranged in matrix so as to constitute a screen of a display device. However, a method in which subpixels for the same colors are arranged in a vertical direction (up-and-down direction) or in a transverse direction (right-and-left direction) is known as an arrangement method of the pixels.

However, the light emitted from the OLED of emitting white light is diffused light. A certain transparent layer having a thickness which is formed by an inorganic film or a resin film for sealing the OLED is provided between the OLED and the color filter. Thus, in the electro-optical device of a color filter type, there is a problem that a portion of light emitted from an OLED of a certain subpixel is transmitted through a color filter of an adjacent subpixel, and thus color mixing occurs depending on an angle at which a screen is observed.

In a technology in which subpixels of the same color are arranged in a vertical direction (up-and-down direction) of a screen, even though the screen is observed at a tilted angle, color shift hardly occurs regarding the vertical direction. Regarding a transverse (right-and-left) direction, in a case where a panel is observed at an inclined angle, color-mixed light such as light of mixed color of red and green, light of mixed color of red and blue, and light of mixed color of green and blue is visually recognized. Thus, the color shift occurs in comparison to a case of being observed from the front.

JP-A-2013-211147 proposes that reflection electrodes of subpixels of red and green are arranged in the transverse direction (right-and-left direction), and a reflection electrode of a subpixel of blue is disposed in a direction (up-and-down direction) perpendicular to the reflection electrodes of subpixels of red and green.

However, in the electro-optical device disclosed in JP-A-2013-211147, scanning lines for subpixels of color are arranged in the vertical direction (up-and-down direction), and thus the number of scanning lines selected for one horizontal scanning period is increased. As a result, a time to select each of the scanning line in the one horizontal scanning period becomes shorter, and thus writing from a data transfer line to a pixel may be difficult.

As in JP-A-2013-211147, the width of a reflective layer in a transverse direction (right-and-left direction) in a subpixel of blue is shorter than the width of the reflective layer in the transverse direction (right-and-left direction) in one pixel obtained by combining a subpixel of red and a subpixel of green. Thus, blue light is applied to a transistor, and thus transistor characteristics may be changed.

SUMMARY

An advantage of some aspects of the embodiment is to provide an electro-optical device which can prevent applying of light from a light emitting layer to a transistor and prevent reducing of a selection time of each scanning line even though subpixels of at least one color are arranged in the transverse (right and left) direction, and to provide an electronic apparatus including the electro-optical device.

According to an aspect of the embodiment, an electro-optical device includes a plurality of first conductive layers each of which is extended in a first direction, a plurality of second conductive layers each of which is extended in a second direction which intersects with the first direction, and a plurality of subpixels each of which is arranged to corresponding intersection between the plurality of first conductive layers and the plurality of second conductive layers. Each of the plurality of subpixels includes a third conductive layer of a light emitting element, a plurality of transistors, a fourth conductive layer which is disposed so as to overlap at least one transistor of the plurality of transistors, and a fifth conductive layer which is electrically connected to at least one transistor of the plurality of transistors, and is disposed on a layer between the third conductive layer and the fourth conductive layer. The plurality of transistors is disposed in a pixel circuit region of which a width in the first direction is narrower than a width in the second direction. One conductive layer among the plurality of first conductive layers is electrically connected to transistors which are at least one of the plurality of transistors included in each of two subpixels which are adjacent to each other in the first direction among the plurality of subpixels. The third conductive layer of at least one subpixel of the plurality of subpixels has a width in the first direction, which is wider than a width in the second direction, and overlaps the fourth conductive layer and at least one transistor of the plurality of transistors in the at least one subpixel.

According to this aspect, the third conductive layer of a light emitting element in at least one subpixel, for example, a reflective layer has a width in the first direction which is wider than the width in the second direction. For example, the reflective layer as an example of the third conductive layer of the light emitting element in a subpixel of a blue display color has a width in a row direction as an example of the first direction which is wider than the width in a column direction as an example of the second direction. Thus, in a case where a direction to which the main light line of the electro-optical device is largely inclined is designed so as to be set as the first direction, subpixels of the same color can be arranged in a first direction of a display surface. As a result, there is provided an electro-optical device in which color shift hardly occurs regarding the first direction, even though a display surface is observed at an inclined angle.

In addition, the reflective layer as an example of the third conductive layer is disposed so as to overlap at least one transistor and the fourth conductive layer. Thus, light from a light emitting layer is blocked by the reflective layer as an example of the third conductive layer, and thus applying of the light to the transistor is prevented. The fourth conductive layer is disposed so as to overlap at least one transistor of the plurality of transistors. The third conductive layer is disposed so as to overlap the fourth conductive layer. Thus, for example, light from the light emitting layer is blocked by the reflective layer as an example of the third conductive layer, and is also blocked by the fourth conductive layer. Thus, applying of the light to the transistor is reliably prevented.

The fifth conductive layer which is electrically connected to at least one transistor of the plurality of transistors is disposed on a layer between the third conductive layer and the fourth conductive layer. Thus, noise occurring by a relay electrode as an example of the fifth conductive layer which is electrically connected to at least one transistor, and in which a large current flows is blocked by the fourth conductive layer. Accordingly, an influence on the transistor is suppressed.

In the electro-optical device according to the above-described aspect, the plurality of first conductive layers may be scanning lines. According to this aspect, the plurality of transistors in a subpixel is disposed in the pixel circuit region of which the width in the first direction is narrower than the width in the second direction. Thus, it is possible to commonly use a scanning line for the subpixel. Accordingly, reducing the selection time of each scanning line in one horizontal scanning period is prevented without an increase of the number of scanning lines.

In the electro-optical device according to the above-described aspect, the transistor which overlaps the third conductive layer and the fourth conductive layer among the plurality of transistors may be a drive transistor. According to this aspect, light from the light emitting layer is blocked by the third conductive layer and the fourth conductive layer, and applying of the light to the transistor is prevented. Accordingly, characteristics of the drive transistor are not changed. Thus, the light emitting element stably drives.

In the electro-optical device according to the above-described aspect, the fourth conductive layer may be a power source wiring which is connected to the drive transistor. According to this aspect, light from the light emitting layer is also blocked by the power source wiring, and applying of the light to the drive transistor is prevented. As a result, the light emitting element stably drives without changing the characteristics of the drive transistor.

In the electro-optical device according to the above-described aspect, the fourth conductive layer may be a power source wiring which is extended in the first direction. According to this aspect, light from the light emitting layer is also blocked by the power source wiring as an example of the fourth conductive layer which is provided in the row direction as an example of the first direction. Applying of the light to the transistor is prevented.

In the electro-optical device according to the above-described aspect, areas of third conductive layers in at least two subpixels of the plurality of subpixels may be different from each other. The fifth conductive layer in each of the at least two subpixels may be disposed so as to overlap the third conductive layer having a smallest area among the third conductive layers in the at least two subpixels. According to this aspect, it is possible to reduce the length of the fifth conductive layer which is connected to at least one transistor in each subpixel. Thus, noise occurring by the fifth conductive layer in which a large current flows is reduced, and thus an influence on the transistor by the noise is suppressed.

In the electro-optical device according to the above-described aspect, a connection portion in one subpixel of the plurality of subpixels electrically connects the fifth conductive layer in the one subpixel to at least one transistor of the plurality of transistors in the one subpixel, the connection portion may be positioned between the third conductive layer in the one subpixel and a third conductive layer in another subpixel which is adjacent to the one subpixel in the first direction. According to this aspect, it is possible to equalize the length of the fifth conductive layer which is connected to at least one transistor in each subpixel, and variation in drive occurring by the transistor is prevented.

In the electro-optical device according to the above-described aspect, each of connection portions in the at least two subpixels electrically connects the fifth conductive layer to corresponding at least one transistor of the plurality of transistors, the connection portions may be positioned on a centerline of the third conductive layer having the smallest area, in the first direction. According to this aspect, it is possible to minimize the length of the fifth conductive layer which is connected to at least one transistor in each subpixel. Thus, noise occurring by the fifth conductive layer in which a large current flows is reduced, and thus an influence on the transistor by the noise is suppressed.

In the electro-optical device according to the above-described aspect, each of connection portions in the at least two subpixels electrically connects the fifth conductive layer to corresponding at least one transistor of the plurality of transistors, the connection portions may be disposed so as to overlap the third conductive layer having the smallest area, in a plan view. According to this aspect, it is possible to reduce the length of the fifth conductive layer which connects the transistor in each subpixel, and the third conductive layer. Thus, noise is reduced, and thus an influence on the transistor by the noise is suppressed.

In the electro-optical device according to the above-described aspect, the connection portion in one subpixel of the plurality of subpixels electrically connects the fifth conductive layer in the one subpixel to at least one transistor of the plurality of transistors in the one subpixel, the connection portion may be positioned at a location other than an end portion of the plurality of transistors in the one subpixel in the second direction. According to this aspect, it is possible to easily align the connection portion between the third conductive layer and the fifth conductive layer, at the position of the third conductive layer. Thus, it is possible to block light applied to the transistor in a pixel of one pixel unit by the third conductive layer in the pixel of one pixel unit.

In the electro-optical device according to the above-described aspect, the fifth conductive layer in one subpixel of the plurality of subpixels may be formed on the same layer as the plurality of second conductive layers, the fifth conductive layer in the one subpixel may be positioned between one second conductive layer which corresponds to the one subpixel and another second conductive layer which corresponds to other subpixel adjacent to the one subpixel in the first direction. According to this aspect, since the fifth conductive layer is formed on the same layer as that for the second conductive layer, a forming process of the fifth conductive layer and the second conductive layer is simplified. Since the fifth conductive layer is positioned between one second conductive layer and another second conductive layer which are adjacent to each other in the row direction, a parasitic capacitance between the fifth conductive layer and the second conductive layer is connected in series to the second conductive layer, and thus capacitance of the second conductive layer is reduced.

In the electro-optical device according to the above-described aspect, the fifth conductive layer may be formed on a layer different from the plurality of second conductive layers. According to this aspect, a parasitic capacitance between the second conductive layer and an upper layer is connected in series to the second conductive layer, and thus capacitance of the second conductive layer is reduced.

In the electro-optical device according to the above-described aspect, subpixels of the plurality of subpixels which are adjacent to each other in the first direction and have different display colors may be set as one pixel unit. According to this aspect, the plurality of transistors in subpixels of each display color is disposed in the pixel circuit region of which the width in the first direction is narrower than the width in the second direction. Thus, it is possible to commonly use a control line such as a scanning line for the subpixels of each display color. Accordingly, reducing the selection time of each scanning line in one horizontal scanning period is prevented without an increase of the number of control lines. The third conductive layer, for example, the reflective layer has a width in the first direction which is wider than the width in the second direction. For example, the reflective layer as an example of the third conductive layer of the light emitting element in a subpixel of a blue display color has a width in a row direction as an example of the first direction which is wider than the width in a column direction as an example of the second direction. Thus, in a case where a direction to which the main light line of the electro-optical device is largely inclined is designed so as to be set as the first direction, subpixels of the same color can be arranged in a first direction of a display surface. As a result, there is provided an electro-optical device in which color shift hardly occurs regarding the first direction, even though a display surface is observed at an inclined angle.

Next, according to another aspect of the embodiment, an electronic apparatus includes the electro-optical device according to the above-described aspect of the embodiment. Regarding such an electronic apparatus, there is an electronic apparatus which has high image quality and in which the electro-optical device including a light emitting element such as an OLED is provided, and thus no color shift occurs, the change of the characteristics of the transistor occurring by light from the light emitting layer is not changed, and writing from the data transfer line to a pixel is reliably performed.

BRIEF DESCRIPTION OF THE DRAWINGS

The embodiment will be described with reference to the accompanying drawings, wherein like numbers reference like elements.

DESCRIPTION OF EXEMPLARY EMBODIMENTS

Figure 1:
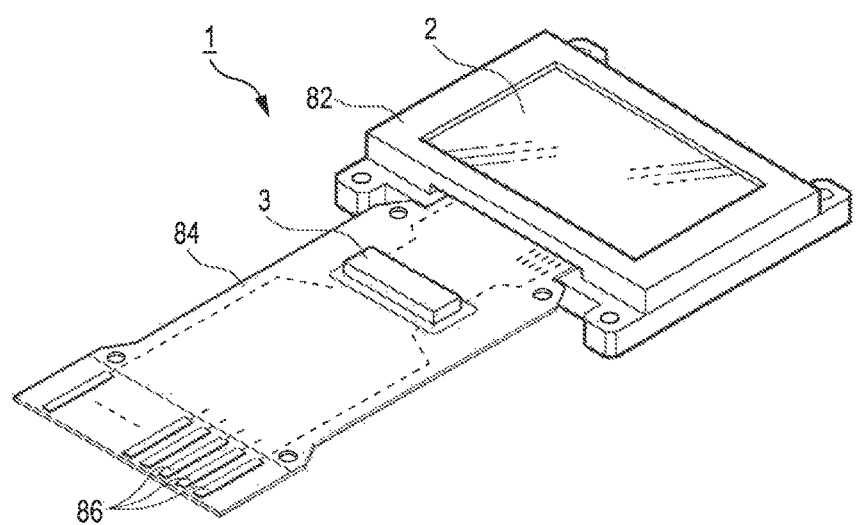
FIG. 1 is a perspective view illustrating an electro-optical device according to a first exemplary embodiment.

Exemplary embodiments will be described with reference to the drawings. In the following drawings, a scale for each layer or each member varies in order to enlarge each layer or each member as large as can be recognized in the drawings.

First Exemplary Embodiment

FIG. 1 is a perspective view illustrating a configuration of an electro-optical device 1 according to a first exemplary embodiment. The electro-optical device 1 is, for example, a micro-display which displays an image in a head mounted display.

As illustrated in FIG. 1, the electro-optical device 1 includes a display panel 2, and a control circuit 3 for controlling an operation of the display panel 2. The display panel 2 includes a plurality of pixel circuits and a drive circuit for driving the pixel circuits. In the exemplary embodiment, the plurality of pixel circuits and the drive circuit provided in the display panel 2 are formed on a silicon substrate, and an OLED which is an example of a light emitting element is used as the pixel circuit. The display panel 2 is stored in, for example, a frame-like case 82 which is open in a display unit, and is connected to one end of a flexible printed circuit (FPC) substrate 84.

The control circuit 3 having a form of a semiconductor chip is mounted on the FPC substrate 84 by the chip-on-film (COF) technology. The FPC substrate 84 has a plurality of terminals 86 provided thereon, and is connected to a higher circuit (not illustrated).

Figure 2:
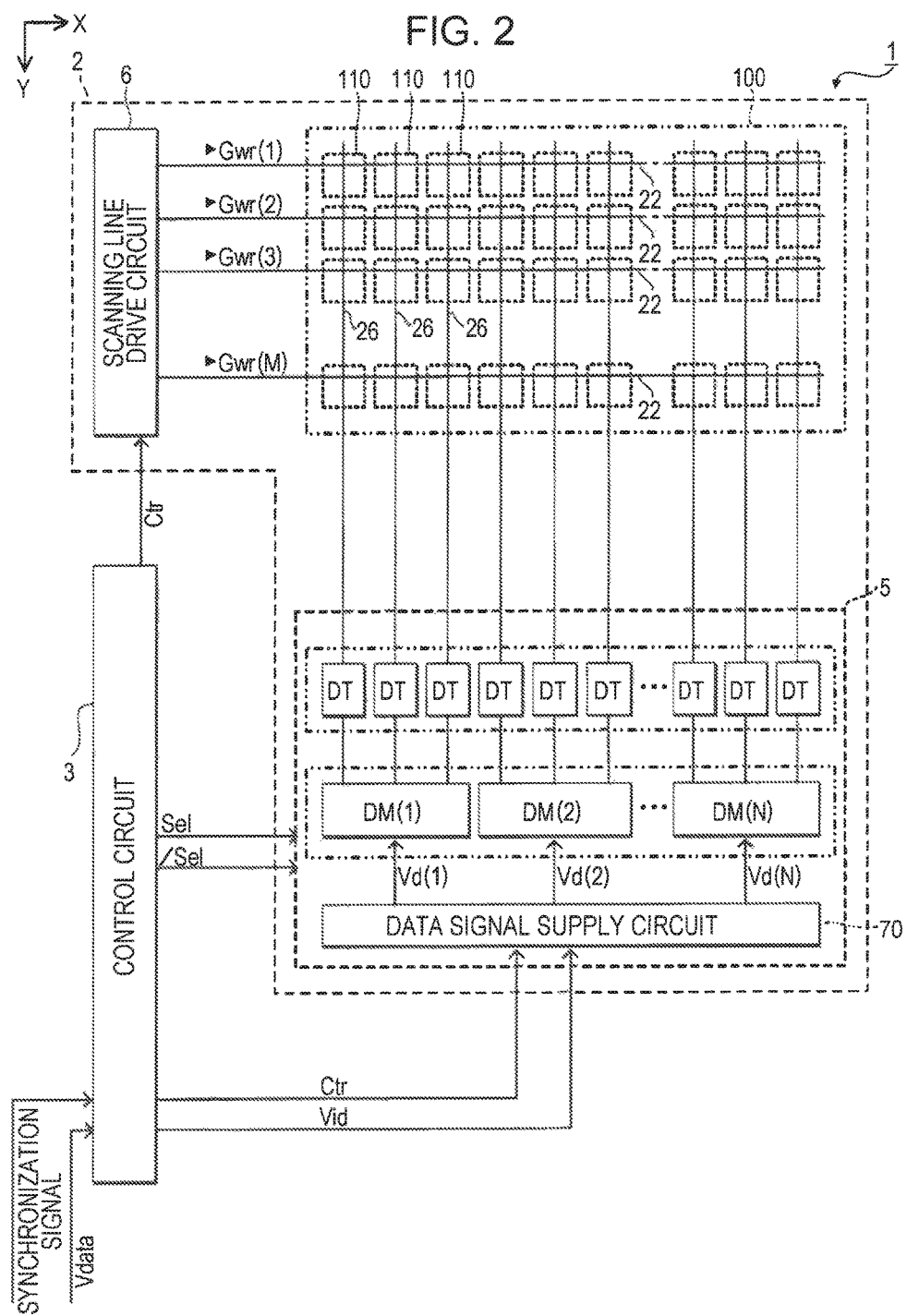
FIG. 2 is a block diagram illustrating a configuration of the electro-optical device according to the first exemplary embodiment.

FIG. 2 is a block diagram illustrating a configuration of the electro-optical device 1 according to the exemplary embodiment. As described above, the electro-optical device 1 includes the display panel 2 and the control circuit 3.

Digital image data Vdata is supplied to the control circuit 3 with synchronization with a synchronization signal, by the higher circuit (not illustrated). Here, the image data Vdata is data of which a gray scale level of a pixel of an image to be displayed in the display panel 2 (strictly, display unit 100 which will be described later) is defined to, for example, be 8 bits. The synchronization signal is a signal including a vertical synchronization signal, a horizontal synchronization signal, and a dot clock signal.

The control circuit 3 generates various control signals based on the synchronization signal, and supplies the generated signals to the display panel 2. Specifically, the control circuit 3 supplies a control signal Ctr, control signals Sel(1), Sel(2), and Sel(3), and control signals /Sel(1), /Sel(2), and/Sel(3) which have a relationship of logic inversion with the control signals Sel(1), Sel(2), and Sel(3), to the display panel 2.

Here, the control signal Ctr is a signal including a pulse signal or a plurality of signals of a clock signal, an enable signal, and the like.

The control signals Sel(1), Sel(2), and Sel(3) may be collectively referred to as a control signal Sel, and the control signals Sel(1), /Sel(2), and /Sel(3) may be collectively referred to as a control signal /Sel.

The control circuit 3 generates an analog image signal Vid based on the image data Vdata. Specifically, a lookup table in which a potential indicating the image signal Vid and luminance of the light emitting element (OLED which will be described later) provided in the display panel 2 are stored in correlation with each other is provided in the control circuit 3. The control circuit 3 generates the image signal Vid indicating a potential which corresponds to luminance of the light emitting element, which is defined in the image data Vdata, with reference to the lookup table. The control circuit 3 supplies the generated image signal Vid to the display panel 2.

As illustrated in FIG. 2, the display panel 2 includes the display unit 100 and a drive circuit (data transfer line drive circuit 5 and scanning line drive circuit 6) for driving the display unit 100.

The pixel circuits 110 which respectively correspond to pixels of an image to be displayed are arranged in matrix, in the display unit 100. In detail, scanning lines 22 of M rows as first conductive layers are provided in the display unit 100, so as to be extended in a row direction (X direction) as an example of a first direction of FIG. 2. In addition, data transfer lines 26 of (3N) column obtained by grouping each of three data transfer lines, as second conductive layers are provided so as to be extended in a column direction (Y direction) as an example of a second direction of FIG. 2, and to hold electrical insulation between the scanning lines 22. In the exemplary embodiment, the pixel circuits 110 are arranged in a matrix of M rows×(3N) columns.

Here, both of M and N are integers. The scanning lines 22 and the pixel circuits 110 may be referred to as a first row, a second row, a third row, . . . , a (M−1)th row, and a Mth row in an order from the top in FIG. 2, in order to distinguish the rows in the matrix of the scanning lines 22 and the pixel circuits 110. Similarly, the data transfer lines 26 and the pixel circuit 110 may be referred to as a first column, a second column, a third column, . . . , a (3N−1)th column, and a (3N)th column in an order from the left in FIG. 2, in order to distinguish the columns in the matrix of the data transfer lines 26 and the pixel circuits 110.

Here, in order to generalize and describe the group of the data transfer line 26, if a certain integer of 1 or more is indicated as n, the (3n−2)th, (3n−1)th, and (3n)th data transfer lines 26 belong to the n-th group when counted from the left.

Three pixel circuits 110 which correspond to the scanning line 22 in the same row, and the data transfer lines 26 of three columns belonging to the same group correspond to sub-pixels of display colors of G (green), R (red), and B (blue), respectively. The three pixel circuits 110 express one bit as one pixel unit of a color image to be displayed by these three subpixels. That is, in the exemplary embodiment, light is emitted from OLEDs corresponding to RGB, and thus a color of one dot is expressed by additive color mixing.

The scanning line drive circuit 6 generates a scanning signal Gwr in accordance with the control signal Ctr. The scanning signal Gwr is used for sequentially scanning the M pieces of scanning line 22 one by one for a period of one frame. Here, scanning signals Gwr supplied to the scanning line 22 of the first row, the second row, the third row, . . . , the M-th row are described as Gwr(1), Gwr(2), Gwr(3), . . . , Gwr(M−1), and Gwr(M), respectively.

The scanning line drive circuit 6 generates various control signals synchronized with the scanning signal Gwr and supplies the generated control signals to the display unit 100, in addition to the scanning signals Gwr(1) to Gwr(M). However, illustrations relating to this are omitted in FIG. 2. The period of a frame is referred to as a period required for causing the electro-optical device 1 to display an image of one cut (frame). For example, if a frequency of the vertical synchronization signal included in the synchronization signal is 120 Hz, the period of a frame is a period of 8.3 milliseconds corresponding to one cycle of the vertical synchronization signal.

The data transfer line drive circuit 5 includes (3N) pieces of data transfer circuits DT, N pieces of demultiplexers DM, and a data signal supply circuit 70. The data transfer circuits DT are provided so as to have one-to-one correspondence with the data transfer lines 26 of (3N) columns. The demultiplexers DM are provided for each of data transfer lines 26 of three columns constituting each group.

The data signal supply circuit 70 generates data signals Vd(1), Vd(2), . . . , and Vd(N) based on the image signal Vid and the control signal Ctr which are supplied by the control circuit 3. That is, the data signal supply circuit 70 generates the data signals Vd(1), Vd(2), . . . , and Vd(N) based on the image signal Vid obtained by performing time division multiplexing of the data signals Vd(1), Vd(2), . . . , and Vd(N). The data signal supply circuit 70 supplies the data signals Vd(1), Vd(2), . . . , and Vd(N) to the demultiplexer DM corresponding to the first, second, . . . , and N-th groups, respectively. The demultiplexer DM turns ON/OFF in accordance with the control signal Sel and the control signal /Sel from the control circuit 3, and sequentially supplies data signals to the data transfer line 26 of three columns constituting each group.

Figure 3:
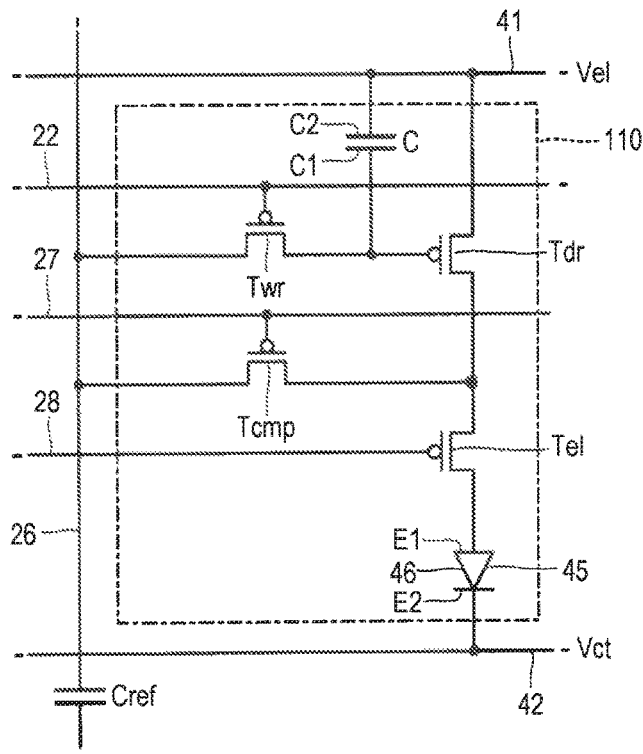
FIG. 3 is a circuit diagram illustrating a configuration of a pixel circuit.

FIG. 3 is a circuit diagram illustrating the pixel circuit 110 of each subpixel positioned in the display unit 100. As illustrated in FIG. 3, the pixel circuit 110 includes a light emitting element 45, a drive transistor Tdr, a writing control transistor Twr, a capacitive element C, a light-emitting control transistor Tel, and a compensation transistor Tcmp. In the exemplary embodiment, the transistors (Tdr, Tel, Twr, and Tcmp) of the pixel circuit 110 are set to be P-channel type transistors, but N-channel type transistors may be also used.

The light emitting element 45 is an electro-optical element in which a light-emitting function layer 46 including a light emitting layer of an organic EL material (OLED) is interposed between a first electrode (anode) E1 and a second electrode (cathode) E2. The first electrode E1 is separately formed in each of the pixel circuits 110, and the second electrode E2 is formed so as to continue over the plurality of pixel circuits 110. As understood from FIG. 3, the light emitting element 45 is disposed on a path of linking the first power conducting member (below set to be a power source wiring) 41 as a fourth conductive layer, and a second power conducting member 42. A power source potential Vel on a high potential side is supplied to the power source wiring 41. A power source potential (for example, ground potential) Vct on a low potential side is supplied to the second power conducting member 42. The pixel circuit 110 in the exemplary embodiment may be driven by either of so-called the coupling driving method and so-called the current programming method. Firstly, driving by the coupling driving method will be described.

The light-emitting control transistor Tel functions as a switch for controlling a conduction state (conduction/unconduction) between one (drain or source) of a pair of current ends of the drive transistor Tdr, and the first electrode E1 of the light emitting element 45. The drive transistor Tdr generates a drive current which has a current quantity depending on a gate-source voltage of the drive transistor Tdr. In a state where the light-emitting control transistor Tel is controlled to be in an ON state, the drive current is supplied to the light emitting element 45 from the drive transistor Tdr through the light-emitting control transistor Tel, and thus the light emitting element 45 emits light with luminance depending on the current quantity of the drive current. In a state where the light-emitting control transistor Tel is controlled to be in an OFF state, the supply of the drive current to the light emitting element 45 is blocked, and thus the light emitting element 45 goes out. The gate of the light-emitting control transistor Tel is connected to the control line 28.

The compensation transistor Tcmp has a function to perform compensation for fluctuation of a threshold voltage of the drive transistor Tdr. In the state where the light-emitting control transistor Tel is in the OFF state, and in a state where the writing control transistor Twr and the drive transistor Tdr are controlled to be in the ON state, operations as follows are performed. If the compensation transistor Tcmp is controlled to be in the ON state, the gate potential of the drive transistor Tdr is equal to the drain potential or the source potential, and thus the drive transistor Tdr is diode-connected. Thus, a current flowing in the drive transistor Tdr charges a gate node and the data transfer line 26. In detail, the current flows on a path of power source wiring 41→drive transistor Tdr→compensation transistor Tcmp→data transfer line 26. Thus, potentials of the data transfer line 26 and the gate node which are in a connection state to each other by the drive transistor Tdr being controlled to be in the ON state rise from the potentials in an initial state. However, if the threshold voltage of the drive transistor Tdr is set to be |Vth|, it is difficult to cause the current flowing on the path to flow as the potential of the gate node is approximate to a potential (Vel−|Vth|). As a result, the data transfer line 26 and the gate node are saturated at a potential (Vel−|Vth|) until a compensation period in which the compensation transistor Tcmp is in the OFF state is ended. Accordingly, the capacitive element C holds the threshold voltage |Vth| of the drive transistor Tdr until the compensation period in which the compensation transistor Tcmp is in the OFF state is ended.

In the exemplary embodiment, the compensation period and a writing period are provided in the horizontal scanning period. The scanning line drive circuit 6 respectively supplies the scanning signals to the scanning lines 22, and thus sequentially selects each of the plurality of scanning lines 22 for each horizontal scanning period. A writing control transistor Twr of the pixel circuit 110 corresponding to the scanning line 22 which has been selected by the scanning line drive circuit 6 transitions to the ON state. Accordingly, a drive transistor Tdr of each of the pixel circuits 110 transitions to the ON state. The scanning line drive circuit 6 respectively supplies control signals to the control lines 27, and thus sequentially selects each of the plurality of control lines 27 for each compensation period. A compensation transistor Tcmp of the pixel circuit 110 corresponding to the control line 27 which has been selected by the scanning line drive circuit 6 transitions to the ON state. Thus, the capacitive element C holds the threshold voltage |Vth| of the drive transistor Tdr until the compensation period in which the compensation transistor Tcmp is in the OFF state is ended. If the scanning line drive circuit 6 respectively supplies control signals to the control lines 27, and thus the compensation transistor Tcmp of the pixel circuit 110 is controlled to be in the OFF state, a path from the data transfer line 26 to the gate node of the drive transistor Tdr is in a floating state. However, the potential is maintained to be (Vel−|Vth|) by the capacitive element C. Then, the data transfer line drive circuit 5 supplies a grayscale potential (data signal) to the capacitive element Cref in parallel for each writing period. The grayscale potential (data signal) depends on a grayscale designated to each of the pixel circuits 110 by an image signal supplied from an external circuit. Thus, the level of the grayscale potential is shifted by using the capacitive element Cref, and the potential having the shifted level is supplied to the gate of the drive transistor Tdr of each of the pixel circuits 110 through the data transfer line 26 and the writing control transistor Twr. A voltage which depends to the grayscale potential with compensation of the threshold voltage |Vth| of the drive transistor Tdr is held at the capacitive element C. If selection of the scanning line 22 in the writing period is ended, the scanning line drive circuit 6 supplies the control signal to each of the control lines 28, and thus controls the light-emitting control transistor Tel of the pixel circuit 110 corresponding to the control line 28 to be in the ON state. Accordingly, the drive current depending on the voltage which has been held at the capacitive element C in the just previous writing period is supplied to the light emitting element 45 from the drive transistor Tdr through the light-emitting control transistor Tel. As described above, each of the light emitting elements 45 emits light with luminance depending on the grayscale potential, and thus a certain image designated by an image signal is displayed in the display unit 110. Regarding the drive current supplied to the light emitting element 45 from the drive transistor Tdr, an influence of the threshold voltage is cancelled, and thus compensation for variation thereof is performed even when the threshold voltage of the drive transistor Tdr varies for each of the pixel circuits 110. Since the current depending on a grayscale level is supplied to the light emitting element 45, and thus an occurrence of display unevenness such as damage of uniformity on a display screen is suppressed. As a result, display having high quality is possible.

Figure 4:
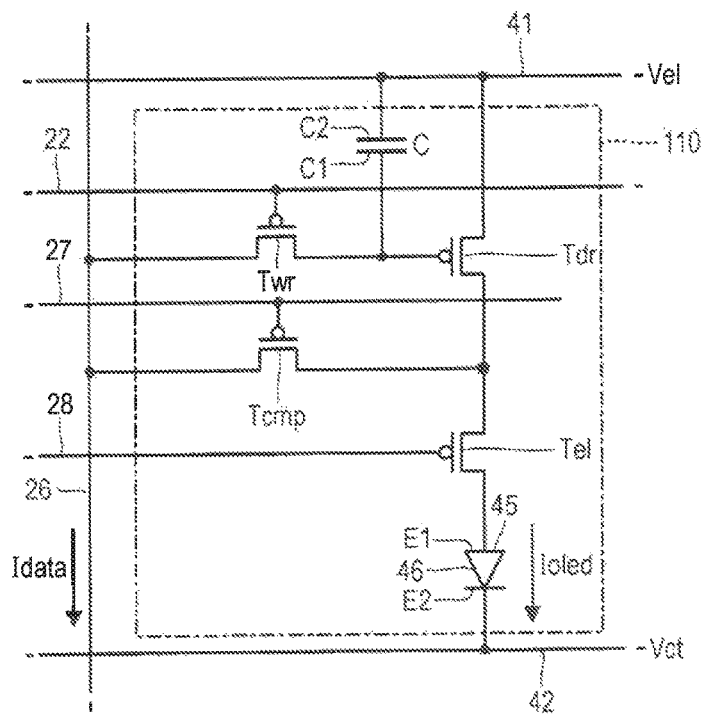
FIG. 4 is a circuit diagram illustrating a configuration of the pixel circuit.

Next, driving by the current programming method will be described with reference to FIG. 4. If the scanning signal of the scanning line 22 has an L level, the writing control transistor Twr turns in the ON state. If the control signal of the control line 27 has an L level, the compensation transistor Tcmp turns in the ON state. Thus, in the drive transistor Tdr, the gate potential is equal to the source potential or the drain potential on a connection side with the light-emitting control transistor Tel, and thus the drive transistor Tdr functions as a diode. If the data signal of the data transfer line 26 has an L level, a current Idata flows on a path of power source wiring 41→drive transistor Tdr→compensation transistor Tcmp→data transfer line 26. At this time, charges depending on the potential at the gate node of the drive transistor Tdr are accumulated in the capacitive element C.

If the control signal of the control line 27 has a H level, the compensation transistor Tcmp turns in the OFF state. At this time, a voltage between both ends of the capacitive element C is maintained to be a voltage when the current Idata flows. If the control signal of the control line 28 has an L level, the light-emitting control transistor Tel turns in the ON state, and a current Ioled depending on the gate voltage flows between the source and the drain of the drive transistor Tdr. In detail, the current Ioled flows on a path of power source wiring 41→drive transistor Tdr→light-emitting control transistor Tel→light emitting element 45.

The current Ioled which flows in the light emitting element 45 is determined by a voltage between the gate node of the drive transistor Tdr, and a drain node or a source node on the connection side with the power source wiring 41. The voltage is a voltage held by the capacitive element C when the current Idata flows in the data transfer line 26 by the scanning signal of an L level. Thus, when the control signal of the control line 28 has an L level, the current Ioled which flows in the light emitting element 45 is substantially equal to the current Idata which has flown just before. In this manner, in a case of driving by the current programming method, luminance of emitted light is defined by the current Idata. The scanning line 22 is set to be a wiring different from the control line 27. However, the scanning line 22 and the control line 27 may be used as one piece of wiring.

Figure 5:
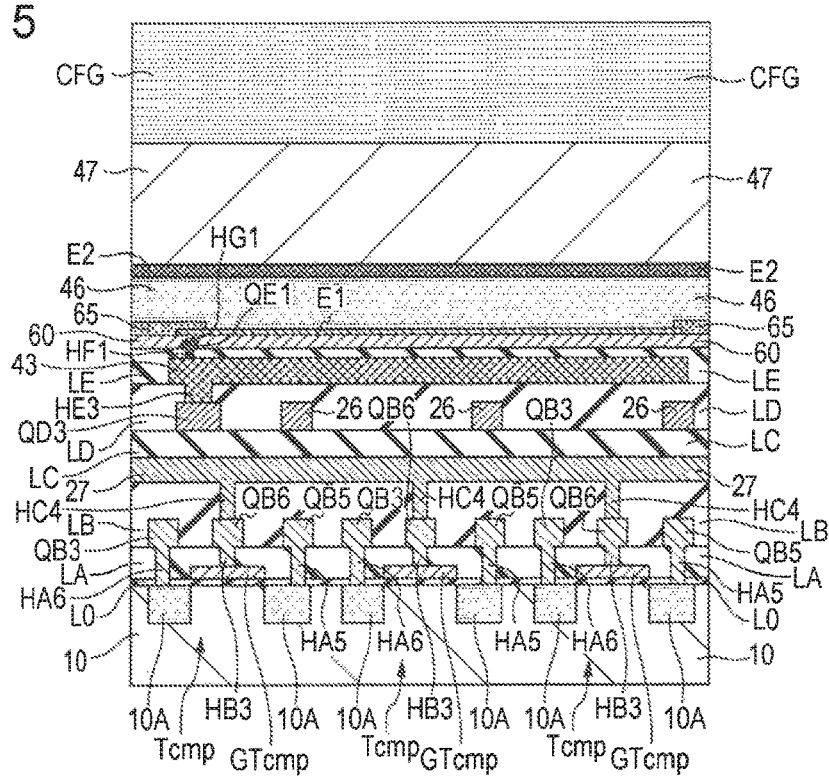
FIG. 5 is a sectional view of a subpixel in a column direction.
Figure 6:
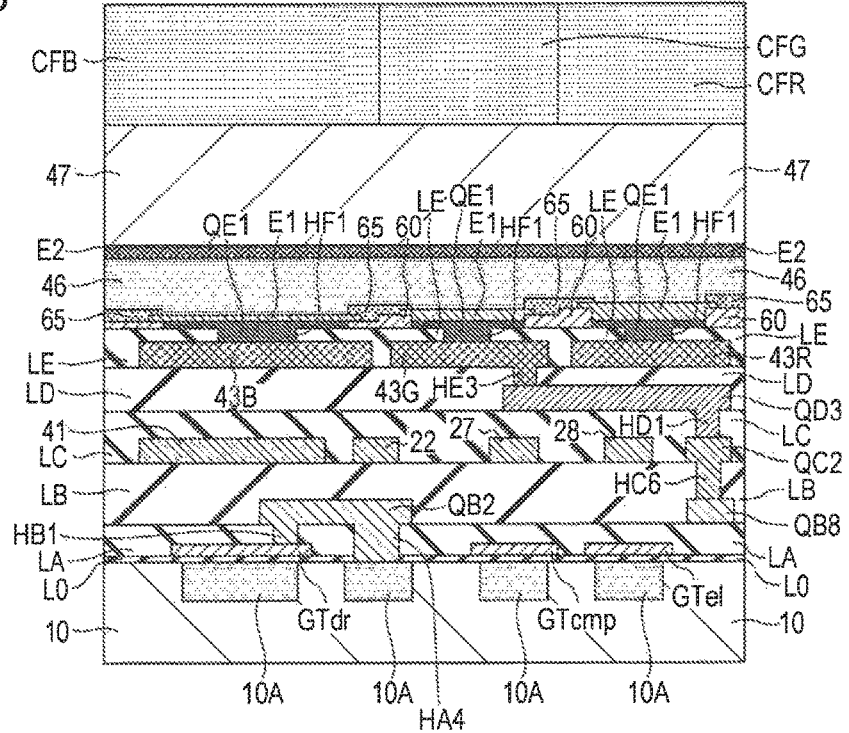
FIG. 6 is a sectional view of a pixel of one pixel unit in a row direction.

A specific structure of the electro-optical device 1 according to the first exemplary embodiment will be described below in detail. In the drawings which are used as a reference in the following descriptions, for convenient descriptions, dimensions or scales of components are different from those of a practical electro-optical device 1. FIG. 5 is a sectional view of a subpixel of a display color of G (green), taken along line V-V illustrated in FIG. 10. FIG. 6 is a sectional view of a pixel of one pixel unit, taken along line VI-VI illustrated in FIG. 10. FIGS. 7 to 12 are plan views illustrating a form of a surface of a substrate 10 at each stage for forming components of the electro-optical device 1, focusing on one pixel or two pixels in one pixel unit. In FIGS. 7 to 12, from a viewpoint of easily performing visual recognition of the components, hatching having the same shape in FIGS. 5 and 6 is conveniently added to components which are common in FIGS. 5 and 6.

Figure 7:
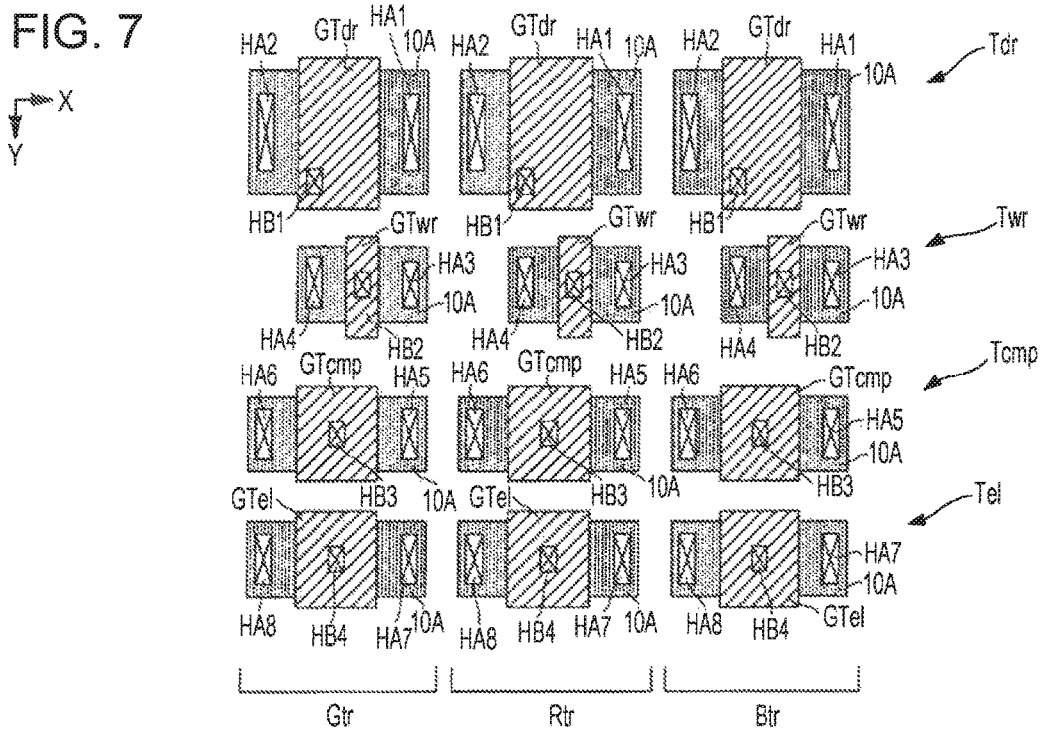
FIG. 7 is a diagram illustrating components formed on a substrate.

As understood from FIGS. 5 to 7, an active region (source/drain region) 10A of each of the transistors (Tdr, Twr, Tel, and Tcmp) in the pixel circuit 110 is formed in the surface of the substrate 10. The substrate 10 is formed of a semiconductor material such as silicon. Ions are injected to the active region 10A. An active layer of each of the transistors (Tdr, Twr, Tel, and Tcmp) in the pixel circuit 110 is provided between the source region and the drain region, and ions of a type different from that in the active region 10 OA are injected to the active layer. However, for convenience, the active layer is illustrated so as to be integrated with the active region 10A. As understood from FIGS. 5 to 7, the surface of the substrate 10 in which the active region 10A is formed is covered with an insulating film (gate insulating film) L0, and gate layers GT (GTdr, GTwr, GTel, and GTcmp) of the transistors are formed on a surface of the insulating film L0. The gate layer GT of each of the transistors faces the active layer with the insulating film L0 interposed between the gate layer G and the active layer.

In the exemplary embodiment, as illustrated in FIG. 7, in each of subpixels of G (green), R (red), and B (blue), the plurality of transistors (Tdr, Twr, Tel, and Tcmp) are disposed in a pixel circuit region of which the width in the row direction (X direction) is narrower than the width in the column direction (Y direction). In FIGS. 7 to 12, in each subpixel of G (green), a plurality of transistors is indicated by Gtr. In each subpixel of R (red), a plurality of transistors is indicated by Rtr. In each subpixel of B (blue), a plurality of transistors is indicated by Btr.

As understood from FIGS. 5 and 6, a multilayer wiring layer in which a plurality of insulating layers L (LA to LE) and a plurality of conductive layers (wiring layers) are alternately stacked is formed on the surface of the insulating film L0 on which the gate layer GT of each of the transistors is formed. Each of the insulating layers L is formed of, for example, an insulating inorganic material such as a silicon compound (typically, silicon nitride or silicon oxide). In the following descriptions, a relation in which a plurality of elements is integrally formed in the same process by selective removal of the conductive layer (single layer or plurality of layers) is described as "being formed from the same layer".

The insulating layer LA is formed on the surface of the insulating film L0 on which the gate layer GT of each of the transistors is formed. As understood from FIGS. 5, 6, and 8, a plurality of relay electrodes QB (QB1, QB2, QB3, QB4, QB5, QB6, QB7, and QB8) are formed on the surface of the insulating layer LA, from the same layer.

Figure 8:
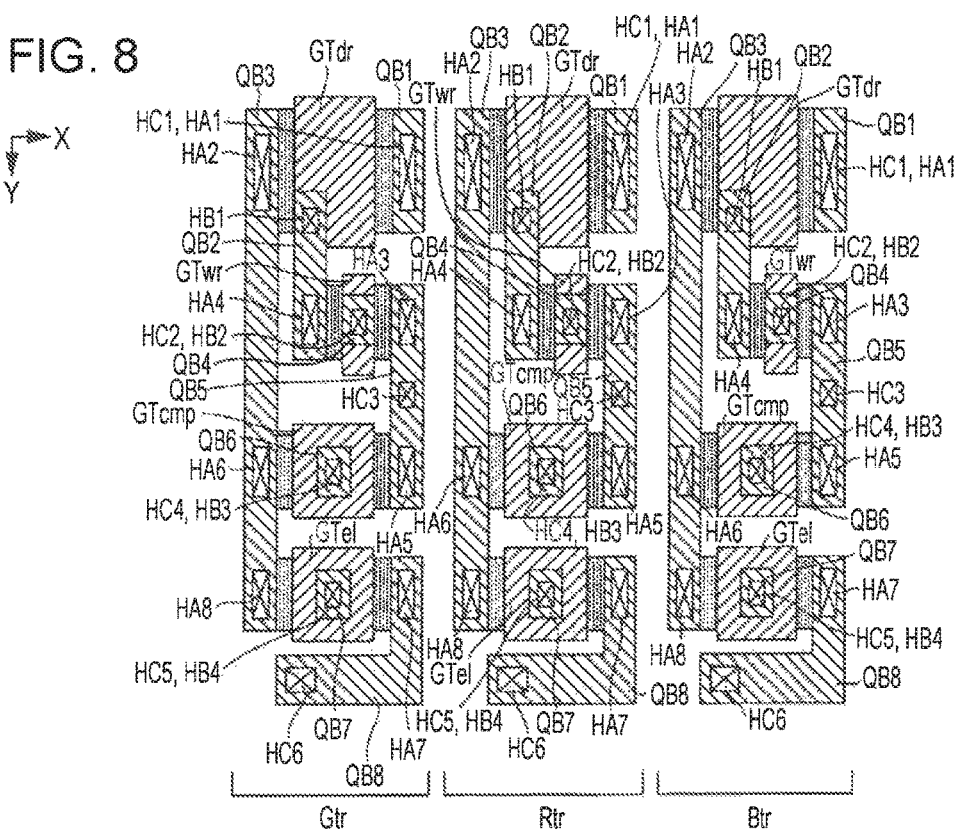
FIG. 8 is a diagram illustrating components formed on the substrate.

As understood from FIGS. 5 and 8, the relay electrode QB1 is conducted to the active region 10A which forms the drain region or the source region of the drive transistor Tdr, through a conduction hole HA1 which penetrates the insulating layer LA and the insulating film L0.

The relay electrode QB2 is conducted to the gate layer GTdr of the drive transistor Tdr through a conduction hole HB1 which penetrates the insulating layer LA. The relay electrode QB2 is conducted to the active region 10A which forms the source region or the drain region of the writing control transistor Twr, through a conduction hole HA4 which penetrates the insulating layer LA and the insulating film L0.

The relay electrode QB3 is conducted to the active region 10A which forms the drain region or the source region of the drive transistor Tdr, through a conduction hole HA2 which penetrates the insulating film L0 and the insulating layer LA.

The relay electrode QB3 is conducted to the active region 10A which forms a drain region or a source region of the compensation transistor Tcmp, through a conduction hole HA6 which penetrates the insulating film L0 and the insulating layer LA. The relay electrode QB3 is electrically connected to the active region 10A which forms a drain region or a source region of the light-emitting control transistor Tel, through a conduction hole HA8 which penetrates the insulating film L0 and the insulating layer LA.

The relay electrode QB4 is conducted to the gate layer GTwr of the writing control transistor Twr through a conduction hole HB2 which penetrates the insulating layer LA.

The relay electrode QB5 is electrically connected to the active region 10A which forms the drain region or the source region of the writing control transistor Twr, through a conduction hole HA3 which penetrates the insulating film L0 and the insulating layer LA. The relay electrode QB5 is conducted to the active region 10A which forms the drain region or the source region of the compensation transistor Tcmp, through a conduction hole HA5 which penetrates the insulating film L0 and the insulating layer LA.

The relay electrode QB6 is conducted to the gate layer GTcmp of the compensation transistor Tcmp through a conduction hole HB3 which penetrates the insulating layer LA.

The relay electrode QB7 is conducted to the gate layer GTel of the light-emitting control transistor Tel through a conduction hole HB4 which penetrates the insulating layer LA.

The relay electrode QB8 is electrically connected to the active region 10A which forms the drain region or the source region of the light-emitting control transistor Tel, through a conduction hole HA7 which penetrates the insulating film L0 and the insulating layer LA.

As understood from FIGS. 5 and 6, an insulating layer LB is formed on the surface of the insulating layer LA on which the plurality of relay electrodes QB (QB1, QB2, QB3, QB4, QB5, QB6, QB7, and QB8) is formed. As understood from FIGS. 5, 6, and 9, the power source wiring 41, the scanning line 22, the control line 27 of the compensation transistor Tcmp, the control line 28 of the light-emitting control transistor Tel, and the plurality of relay electrodes QC (QC1 and QC2) are formed on the surface of the insulating layer LB.

The power source wiring 41 as the fourth conductive layer is electrically connected to a mount terminal (not illustrated) to which the power source potential Vel on a high potential side is supplied, through a wiring (not illustrated) in the multilayer wiring layer. The power source wiring 41 is formed in a display region (not illustrated) of the display unit 100. Although not illustrated, another power source wiring is formed in a peripheral region of the display region. This power source wiring is conducted to a mount terminal (not illustrated) to which the power source potential Vct on a low potential side is supplied, through a wiring (not illustrated) in the multilayer wiring layer. The power source wiring 41 and the power source wiring to which the power source potential Vct on the low potential side is supplied are formed by a conductive material containing, for example, silver or aluminium, and are formed so as to have a film thickness of about 100 nm, for example.

Figure 9:
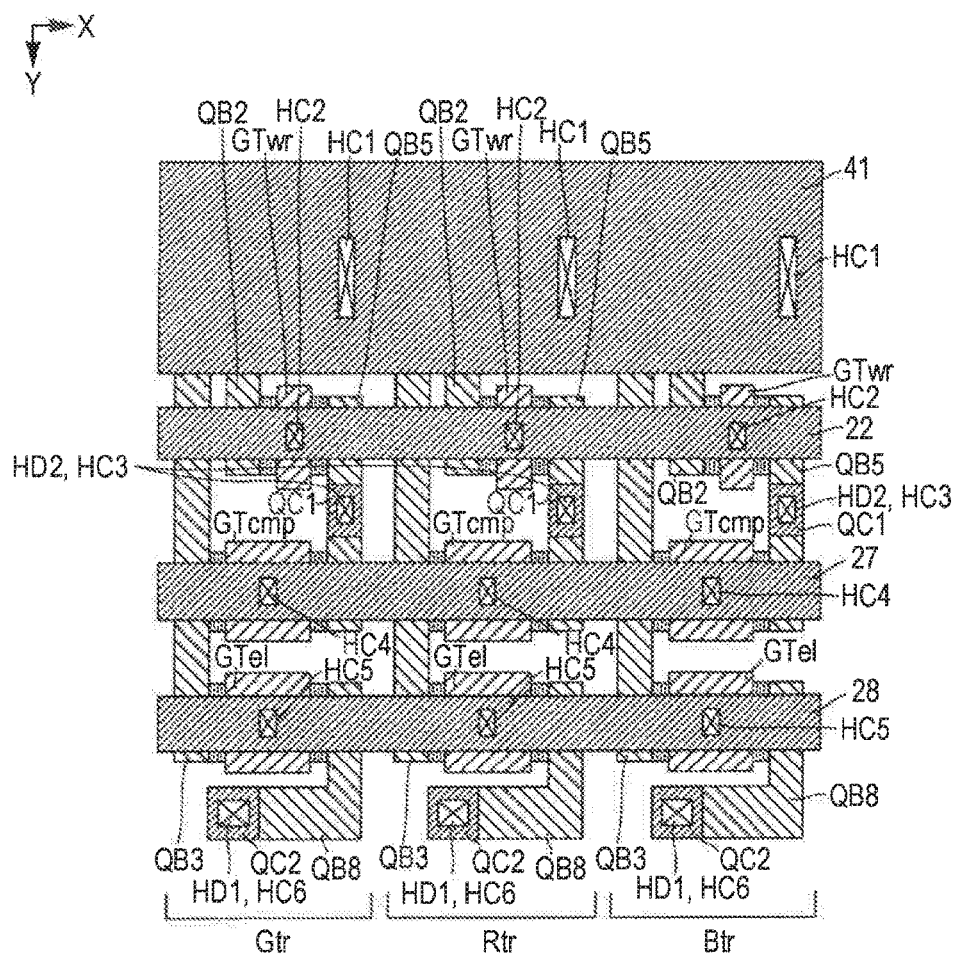
FIG. 9 is a diagram illustrating components formed on the substrate.

As understood from FIG. 9, the power source wiring 41 is linearly extended in the row direction (X direction) over the plurality of pixel circuits 110. That is, the power source wiring 41 is disposed along the row direction (X direction), so as to overlap the drive transistor Tdr of a subpixel of each color in a plan view.

The power source wiring 41 is conducted to the active region 10A which forms the drain region or the source region of the drive transistor Tdr in a subpixel of each color, through a conduction hole HC1 which penetrates the insulating layer LB.

The power source wiring 41 is electrically insulated from the data transfer line 26 which will be described later, by an insulating layer LC.

As understood from FIGS. 6 and 9, the scanning line 22 as the first conductive layer is provided so as to be linearly extended in the row direction (X direction) over the plurality of pixel circuits 110. The scanning line 22 is conducted to the gate layer GTwr of the writing control transistor Twr in a subpixel of each color, through a conduction hole HC2 which penetrates the insulating layer LB. The scanning line 22 is electrically insulated from the data transfer line 26 which will be described later, by an insulating layer LC.

As understood from FIGS. 6 and 9, the control line 27 of the compensation transistor Tcmp is provided so as to be linearly extended in the row direction (X direction) over the plurality of pixel circuits 110. The control line 27 is conducted to the gate layer GTcmp of the compensation transistor Tcmp in a subpixel of each color, through a conduction hole HC4 which penetrates the insulating layer LB. The control line 27 is electrically insulated from the data transfer line 26 which will be described later, by an insulating layer LC.

As understood from FIGS. 6 and 9, the control line 28 of the light-emitting control transistor Tel is provided so as to be linearly extended in the row direction (X direction) over the plurality of pixel circuits 110. The control line 28 is conducted to the gate layer GTel of the light-emitting control transistor Tel in a subpixel of each color, through a conduction hole HC5 which penetrates the insulating layer LB. The control line 28 is electrically insulated from the data transfer line 26 which will be described later, by an insulating layer LC.

As understood from FIGS. 6 and 9, the relay electrode QC1 is conducted to the relay electrode QB5 through a conduction hole HC3 which penetrates the insulating layer LB. The relay electrode QC2 is conducted to the relay electrode QB8 through a conduction hole HC6 which penetrates the insulating layer LB.

The insulating layer LC is formed on the surface of the insulating layer LB on which the power source wiring 41, the scanning line 22, the control line 27 of the compensation transistor Tcmp, the control line 28 of the light-emitting control transistor Tel, and the plurality of relay electrodes QC (QC1 and QC2) are formed. As understood from FIGS. 5, 6, and 10, the data transfer line 26 and a plurality of relay electrodes QD (QD1, QD2, and QD3) as the fifth conductive layer are formed on the surface of the insulating layer LC.

The data transfer line 26 as the second conductive layer is linearly extended in the column direction (Y direction) over the plurality of pixel circuits, and is electrically insulated from reflective layers 43B, 43C, and 43R which will be described later, by an insulating layer LD. As understood from FIG. 10, the data transfer line 26 is conducted to the relay electrode QC1 through a conduction hole HD2 which penetrates the insulating layer LC. That is, the data transfer line 26 is conducted to the active region 10A which forms the drain regions or the source regions of the writing control transistor Twr and the compensation transistor Tcmp, through the conduction hole HD2, the relay electrode QC1, the conduction hole HC3, the relay electrode QB5, the conduction hole HA3, and the conduction hole HA5.

Figure 10:
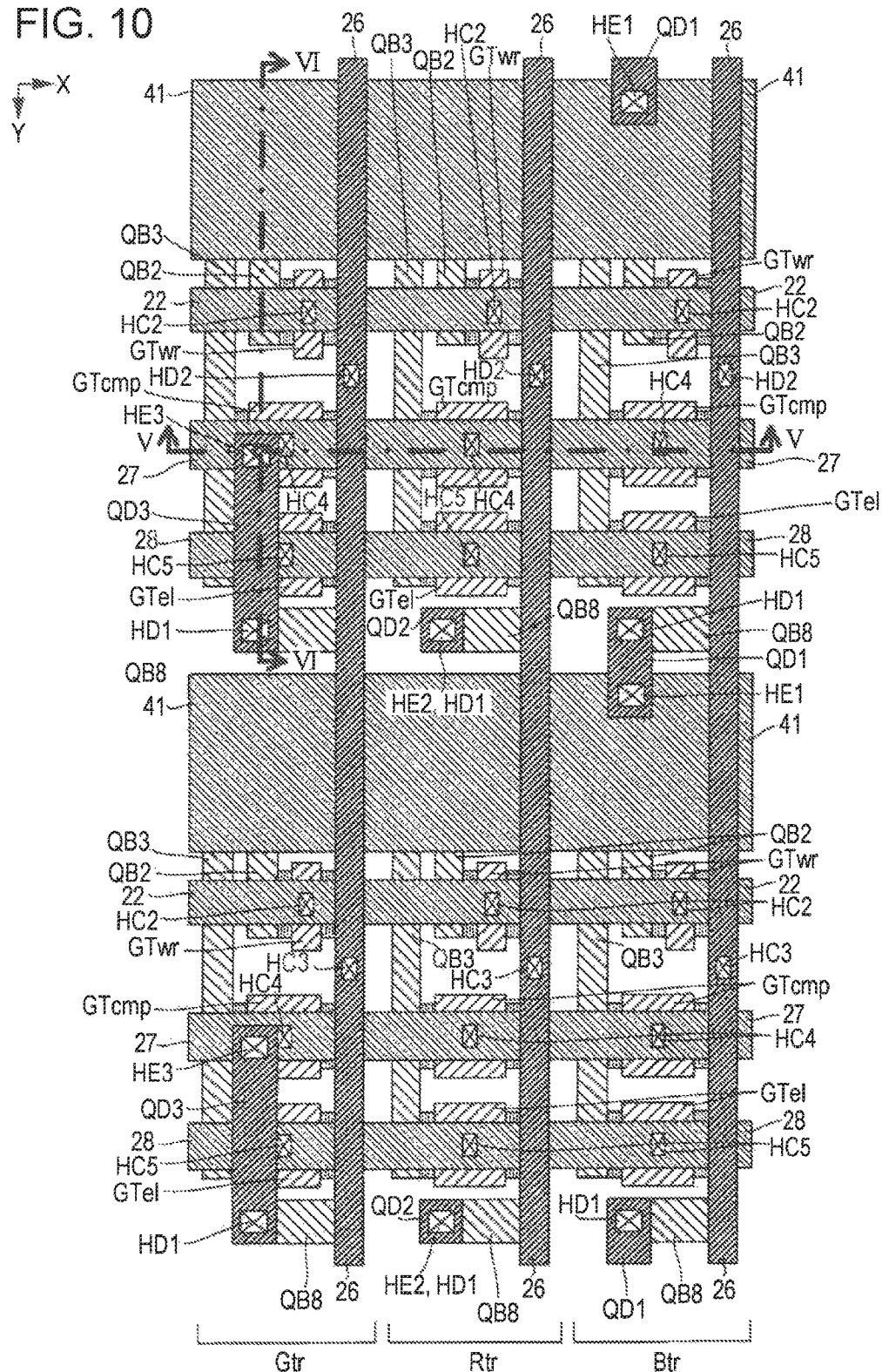
FIG. 10 is a diagram illustrating components formed on the substrate.

As understood from FIGS. 5, 6, and 10, the relay electrode QD1 is conducted to the relay electrode QC2 in a subpixel of a display color of B (blue), through a conduction hole HD1 which penetrates the insulating layer LC. Thus, the relay electrode QD1 is conducted to the active region 10A which forms the drain region or the source region of the light-emitting control transistor Tel in the subpixel of a display color of B (blue), through the conduction hole HD1, the relay electrode QC2, the conduction hole HC6, the relay electrode QB8, and the conduction hole HA7.

As understood from FIGS. 5, 6, and 10, the relay electrode QD2 is conducted to the relay electrode QC2 in a subpixel of a display color of R (red), through the conduction hole HD1 which penetrates the insulating layer LC. Thus, the relay electrode QD1 is conducted to the active region 10A which forms the drain region or the source region of the light-emitting control transistor Tel in the subpixel of a display color of R (red), through the conduction hole HD1, the relay electrode QC2, the conduction hole HC6, the relay electrode QB8, and the conduction hole HA7.

As understood from FIGS. 5, 6, and 10, the relay electrode QD3 is conducted to the relay electrode QC2 in a subpixel of a display color of G (green), through the conduction hole HD1 which penetrates the insulating layer LC. Thus, the relay electrode QD1 is conducted to the active region 10A which forms the drain region or the source region of the light-emitting control transistor Tel in the subpixel of a display color of G (green), through the conduction hole HD1, the relay electrode QC2, the conduction hole HC6, the relay electrode QB8, and the conduction hole HA7.

An insulating layer LD is formed on the surface of the insulating layer LC in which the data transfer line 26 and the plurality of relay electrodes QD (QD1, QD2, and QD3) are formed. As understood from FIGS. 5, 6, and 11, the reflective layers 43B, 43G, and 43R as the third conductive layer are formed on the surface of the insulating layer LD. The reflective layer 43B is a reflective layer in a subpixel of a display color of B (blue). The reflective layer 43G is a reflective layer in a subpixel of a display color of G (green). The reflective layer 43R is a reflective layer in a subpixel of a display color of R (red).

Figure 11:
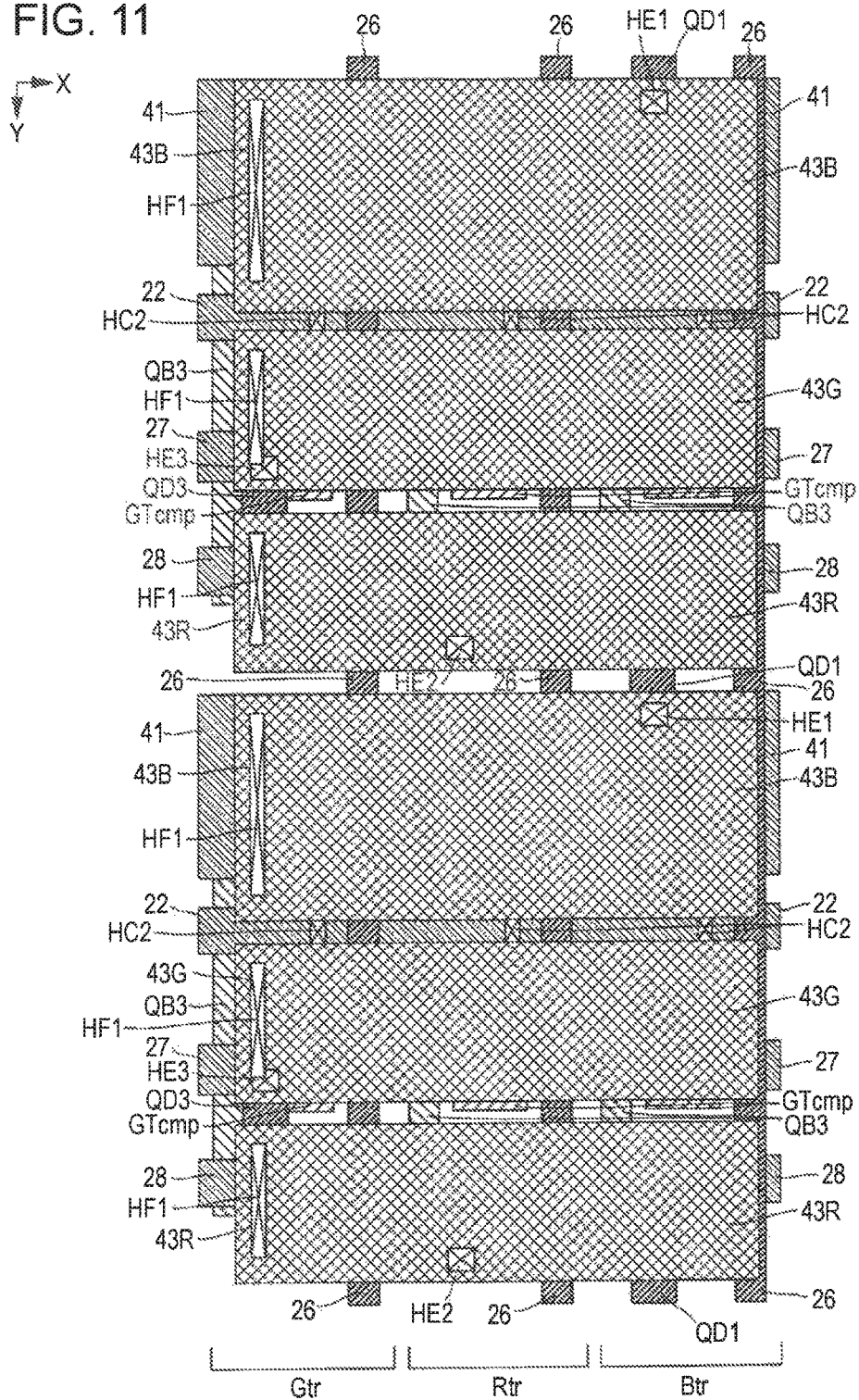
FIG. 11 is a diagram illustrating components formed on the substrate.

As understood from FIG. 11, the reflective layer 43B has a width in the row direction which is wider than the width in the column direction. The reflective layer 43B is disposed along the row direction (X direction), so as to overlap the drive transistor Tdr in a subpixel of each color, in a plan view. Thus, the reflective layer 43B is disposed along the row direction (X direction), so as to overlap three drive transistors Tdr which constitute one pixel unit of a color image to be displayed, that is, to overlap the drive transistor Tdr in a subpixel of B (blue), the drive transistor Tdr in a subpixel of R (red), and the drive transistor Tdr in a subpixel of G (green) in the plan view.

The reflective layer 43B is conducted to the relay electrode QD1 through a conduction hole HE1 which penetrates the insulating layer LD. That is, the reflective layer 43B is conducted to the active region 10A which forms the drain region or the source region of the light-emitting control transistor Tel in a subpixel of B (blue), through the conduction hole HE1, the relay electrode QD1, the conduction hole HD1, the relay electrode QC2, the conduction hole HC6, the relay electrode QB8, and the conduction hole HA7.

As illustrated in FIG. 11, in a plan view, the reflective layers are provided in an order of the reflective layers 43B, 43G, and 43R, and the plurality of transistors in subpixels of the colors which overlap the reflective layers 43B, 43G, and 43R are used as a plurality of transistors in a pixel of one pixel unit. Thus, the reflective layer 43B is conducted to the active region 10A which forms the drain region or the source region of the light-emitting control transistor Tel in a subpixel of B (blue) in a pixel of one pixel unit before one pixel, in the column direction (Y direction).

The reflective layer 43R is conducted to the relay electrode QD2 through a conduction hole HE2 which penetrates the insulating layer LD. That is, the reflective layer 43R is conducted to the active region 10A which forms the drain region or the source region of the light-emitting control transistor Tel in a subpixel of R (red), through the conduction hole HE2, the relay electrode QD2, the conduction hole HD1, the relay electrode QC2, the conduction hole HC6, the relay electrode QB8, and the conduction hole HA7.

The reflective layer 43G is conducted to the relay electrode QD3 through a conduction hole HE3 which penetrates the insulating layer LD. That is, the reflective layer 43G is conducted to the active region 10A which forms the drain region or the source region of the light-emitting control transistor Tel in a subpixel of G (green), through the conduction hole HE3, the relay electrode QD3, the conduction hole HD1, the relay electrode QC2, the conduction hole HC6, the relay electrode QB8, and the conduction hole HA7.

The reflective layers 43B, 43G and 43R are formed by, for example, a photoreflective conductive material containing silver or aluminium, and are formed so as to have a film thickness of about 100 nm, for example. As illustrated in FIG. 11, the reflective layers 43B, 43G, and 43R are respectively disposed so as to overlap the transistors in subpixels of the colors in a plan view. Thus, there are advantages in that it is possible to prevent entering of light from the outside by the reflective layers 43B, 43G, and 43R, and to prevent current leakage of each of the transistor occurring by irradiation with light.

In the exemplary embodiment, the plurality of transistors in subpixels of the colors are disposed in the pixel circuit region of which the width in the row direction (X direction) is narrower than the width in the column direction (Y direction). However, the reflective layers 43B, 43G, and 43R in the subpixels of the colors are disposed along the row direction (X direction). Thus, it is possible to commonly use the scanning lines 22 in the writing control transistors Twr in subpixel of the colors, and to form the display region of the subpixel of the colors so as to have a rectangular form in the row direction (X direction).

An insulating layer LE is formed on the surface of the insulating layer LD in which the reflective layers 43B, 43G, and 43R are formed. As illustrated in FIG. 5, a relay electrode QE1 is formed on the surface of the insulating layer LE.

The relay electrode QE1 is conducted to the reflective layers 43B, 43G, and 43R through a conduction hole HF1 which penetrates the insulating layer LE. The relay electrode QE1 is one of relay electrodes constituting the pixel electrode conduction portion. As understood from FIGS. 5 to 11, the relay electrode QE1 is conducted to the active region 10A which forms the drain region or the source region of the light-emitting control transistor Tel, through the reflective layers 43B, 43G, and 43R, the plurality of relay electrodes, and the plurality of conduction holes.

As illustrated in FIG. 5, an optical path adjusting layer 60 is formed on the surface of the insulating layer LE on which the relay electrode QE1 is formed. The optical path adjusting layer 60 is a light-transmissive film member for defining a resonant wavelength (that is, display color) of a resonant structure of each of the pixel circuits 110. Setting is performed as follows. In pixels of which display colors are the same as each other, resonant wavelengths of resonant structures are the same as each other. In pixels of which display colors are different from each other, resonant wavelengths of resonant structures are different from each other.

Figure 12:
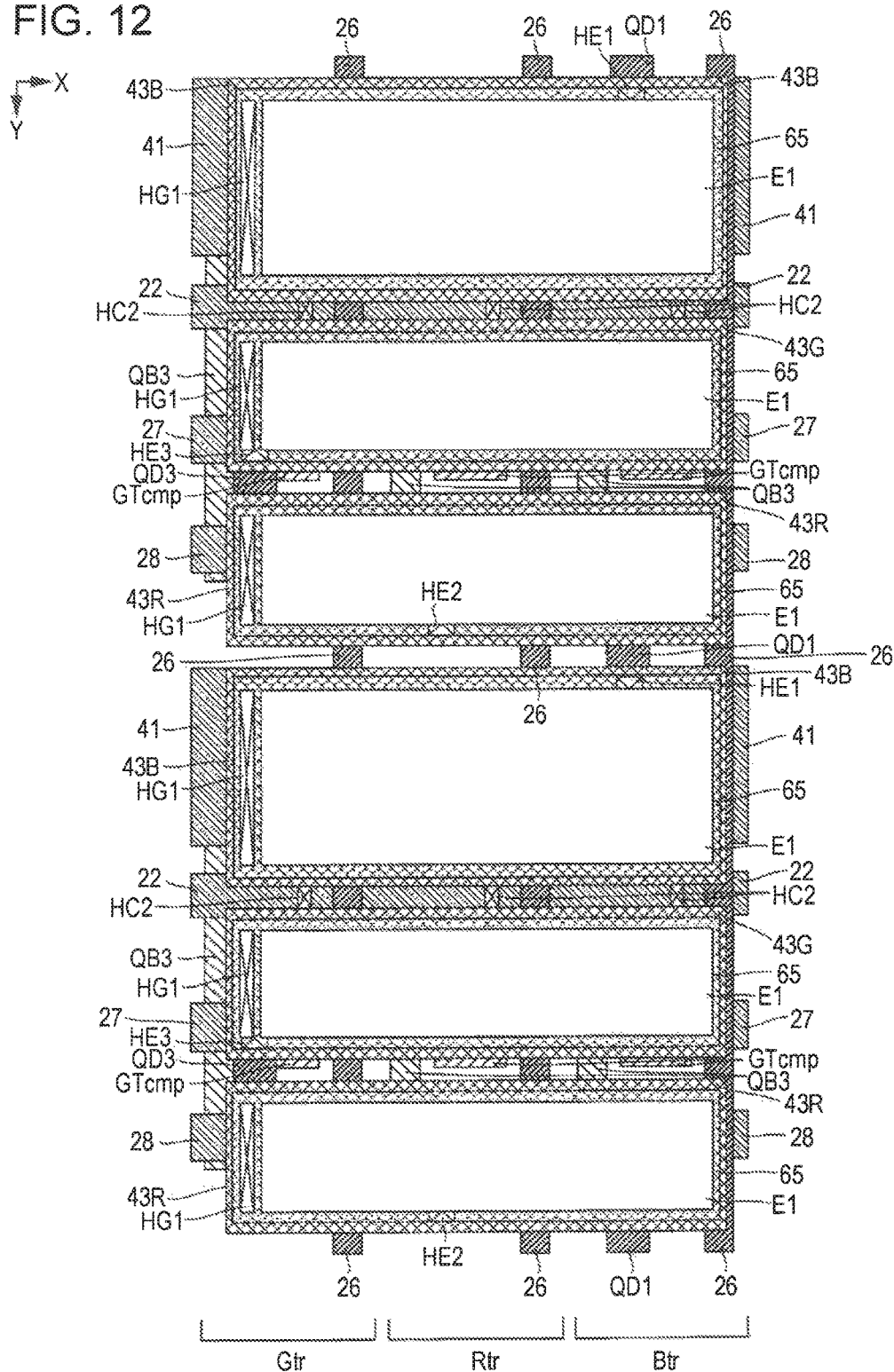
FIG. 12 is a diagram illustrating components formed on the substrate.

As illustrated in FIGS. 5, 6, and 12, the first electrode E1 for each subpixel of each of the colors is formed on the surface of the optical path adjusting layer 60. The first electrode E1 is formed of, for example, a light-transmissive conductive material such as indium tin oxide (ITO). As described above with reference to FIGS. 3 and 4, the first electrode E1 is an electrode (pixel electrode) which has a substantially rectangular shape and functions as an anode of the light emitting element 45. As understood from FIGS. 5, 6, and 12, the first electrode E1 is conducted to the relay electrode QE1 through a conduction hole HG1 formed in the optical path adjusting layer 60. Thus, as understood from FIGS. 5 to 12, the first electrode E1 is conducted to the active region 10A which forms the drain region or the source region of the light-emitting control transistor Tel, through the optical path adjusting layer 60, the reflective layers 43B, 43G and 43R, the plurality of relay electrodes, and the plurality of conduction holes.

As illustrated in FIGS. 5, 6, and 12, the pixel definition layer 65 is formed on the surface of the optical path adjusting layer 60 on which the first electrode E1 is formed, over the entirety of the substrate 10. The pixel definition layer 65 is formed of, for example, an insulating inorganic material such as a silicon compound (typically, silicon nitride or silicon oxide). As understood from FIG. 12, the pixel definition layer 65 causes an opening corresponding to the first electrode E1 in a subpixel of each display color to be formed.

Regarding the size of the opening, the size of an opening in a subpixel of B (blue) is largest, and the sizes of openings in subpixels of G (green) and R (red) are the same as each other. The size of the opening may be set to be different in subpixels of different display colors.

The openings are arranged at a common pitch in the column direction (Y direction), in an order of subpixels of B (blue), G (green), and R (red). Openings in subpixels of the same color are arranged at a common pitch along the row direction (X direction).

As illustrated in FIGS. 5 and 6, the light-emitting function layer 46, the second electrode E2, and a sealing member 47 are stacked on an upper layer of the first electrode E1. A sealing substrate (not illustrated) is bonded to the surface of the substrate 10 in which the above-described elements are formed, by using an adhesive. The sealing substrate is a plate-like member (for example, glass substrate) which is light-transmissive and is used for protecting the elements on the substrate 10. A color filter is formed on the surface of the sealing substrate or the surface of the sealing member 47, for each pixel circuit of a subpixel. As the color filter, a color filter CFB of B (blue), a color filter CFG of G (green), and a color filter CFR of R (red) are used.

As described above, in the exemplary embodiment, the plurality of transistors in subpixels of the colors is disposed along the pixel circuit region of which the width in the row direction (X direction) is narrower than the width in the column direction (Y direction). Thus, the scanning lines 22 can be commonly used in the writing control transistor Twr in subpixels of the colors, and the number of scanning lines 22 selected in one horizontal scanning period is not increased. As a result, it is possible to prevent reducing of a selection time of each of the scanning lines 22 in one horizontal scanning period, and to reliably write data from the data transfer line 26 to the first electrode E1.

In the exemplary embodiment, the plurality of transistors in subpixels of the colors are disposed along the pixel circuit region of which the width in the row direction (X direction) is narrower than the width in the column direction (Y direction), and the reflective layers 43B, 43G, and 43R in the subpixels of the colors have a width in the row direction (X direction) which is wider than the width in the column direction (Y direction). Thus, even in a case where a direction to which the main light line of the electro-optical device 1 is largely inclined is designed so as to be set as the row direction (X direction), it is possible to arrange subpixels of the same color in the row direction (X direction) of the display surface, without an increase of the number of scanning lines 22. As a result, the electro-optical device 1 in which color shift hardly occurs regarding the row direction (X direction) even though the display surface is observed at an inclined angle is provided.

In the exemplary embodiment, the reflective layers 43B, 43G, and 43R in subpixels of the colors are disposed along the row direction (X direction), so as to overlap the transistors in the subpixels of the colors. Accordingly, it is possible to prevent irradiation of the transistor with light from the light-emitting function layer 46, and the characteristics of the transistor are not changed. In particular, the reflective layer 43B in a subpixel of blue having the largest area is disposed so as to overlap the drive transistor Tdr in subpixels of the colors. Thus, irradiation of the drive transistor Tdr with light from the light-emitting function layer 46, which influences elaborated gradation display is reliably prevented, and changing characteristics of the drive transistor Tdr is prevented. Thus, accurate gradation display is possible.

In the exemplary embodiment, the power source wiring 41 which is disposed along the row direction (X direction) so as to overlap the drive transistor Tdr in a subpixel of each color is provided between the reflective layer 43B in a subpixel of blue, and the transistors in a subpixel of each color. Thus, it is possible to block light from the light-emitting function layer 46 by the power source wiring 41 having an area which is relatively larger than that of other wirings, in addition to the reflective layer 43B, and to prevent irradiation of the drive transistor Tdr further more reliably. Accordingly, irradiation of the drive transistor Tdr with light from the light-emitting function layer 46, which influences elaborated gradation display is further more reliably prevented, and changing characteristics of the drive transistor Tdr is prevented. Thus, accurate gradation display is possible.

In the exemplary embodiment, the relay electrodes QD1, QD2, and QD3 which connect the reflective layers 43B, 43G and 43R in subpixels of the colors, with the light-emitting control transistors Tel in the subpixels of the colors are formed on a layer between a layer in which the power source wiring 41 is formed, and a layer on which the reflective layers 43B, 43G, and 43R are formed. Thus, noise from the relay electrodes QD1, QD2, and QD3 in which a large current flows is blocked by the power source wiring 41, and thus it is possible to suppress an influence of the noise on the drive transistor Tdr.

In the exemplary embodiment, the area of the reflective layer 43B is different from the areas of the reflective layers 43G and 43R. The area of the reflective layer 43B is largest, and the area of the reflective layer 43G is equal to the area of the reflective layer 43R, and thus the areas of the reflective layers 43G and 43R are smaller than the area of the reflective layer 43B. That is, the areas of at least two reflective layer among the reflective layers 43B, 43G; and 43R are set to be different from each other. The relay electrodes QD1, QD3, and QD2 which connect the reflective layers 43B, 43C, and 43R in subpixels of the colors, with the light-emitting control transistors Tel in the subpixels of the colors are formed on a lower layer of the reflective layers 43G and 43R which have the smallest area. Thus, it is possible to reduce the length of the relay electrodes QD1, QD3, and QD2. As a result, it is possible to reduce the noise from the relay electrodes QD1, QD3, and QD2 in which a large current flows, and to suppress an influence on the drive transistor Tdr by the noise.

In the exemplary embodiment, the conduction hole HD1 which is a connection portion for connecting the relay electrodes QD1, QD2, and QD3 with the light-emitting control transistor Tel is positioned on a lower layer close to the reflective layers 43G and 43R which are reflective layers having the smallest area, in a plan view. With this configuration, it is also possible to reduce the length of the relay electrodes QD1, QD2, and QD3. As a result, it is possible to reduce the noise from the relay electrodes QD1, QD2, and QD3 in which a large current flows, and to suppress an influence on the drive transistor Tdr by the noise.

The relay electrodes QD1, QD2, and QD3 are formed on the same layer as that for the data transfer line 26, and are positioned between one data transfer line 26 and another data transfer line 26 which are adjacent to each other in the row direction. Thus, a parasitic capacitance is formed between the data transfer line 26 and the relay electrodes QD1, QD2, and QD3. In order to reduce the parasitic capacitance, the relay electrodes QD1, QD2, and QD3 are preferably positioned at substantially the center between one data transfer line 26 and another data transfer line 26 which are adjacent to each other. It is possible to reduce a writing period of data into the data transfer line 26 and a writing period of data from the data transfer line 26 into the first electrode E1.

In the above-described exemplary embodiment, as understood from FIGS. 10 and 11, the conduction hole HD1 which is a connection portion for connecting the relay electrodes QD1, QD2, and QD3 with the light-emitting control transistor Tel is disposed at a position shifted from the centerline of the reflective layer 43R in the row direction.

However, the embodiment is not limited to such a configuration. For example, as illustrated in FIGS. 13 and 14, the conduction hole HD1 which is a connection portion for connecting the relay electrodes QD1, QD2, and QD3 with the light-emitting control transistor Tel may be disposed on the centerline of the reflective layer 43R in the row direction.

Figure 13:
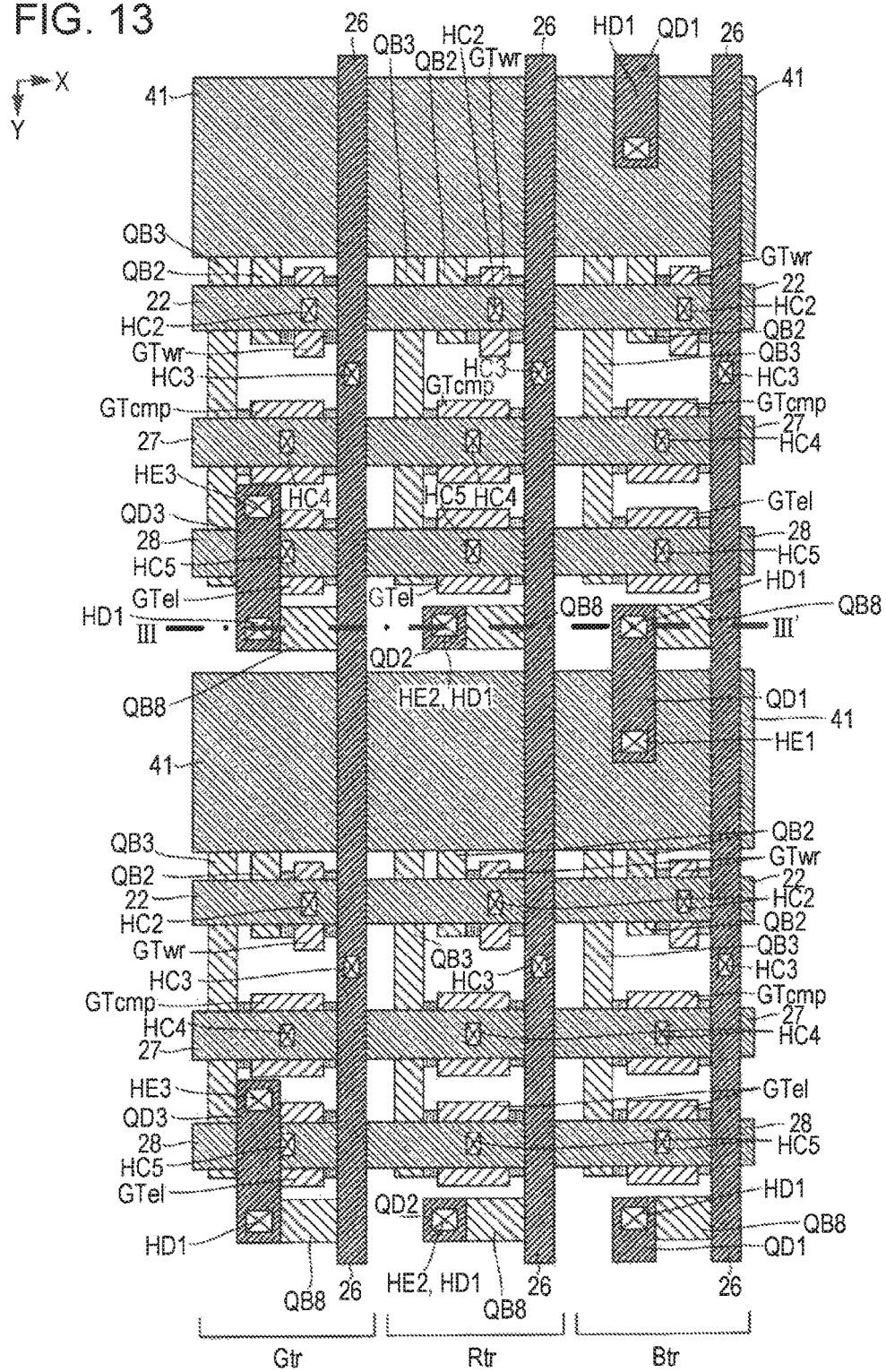
FIG. 13 is a diagram illustrating components formed on the substrate.
Figure 14:
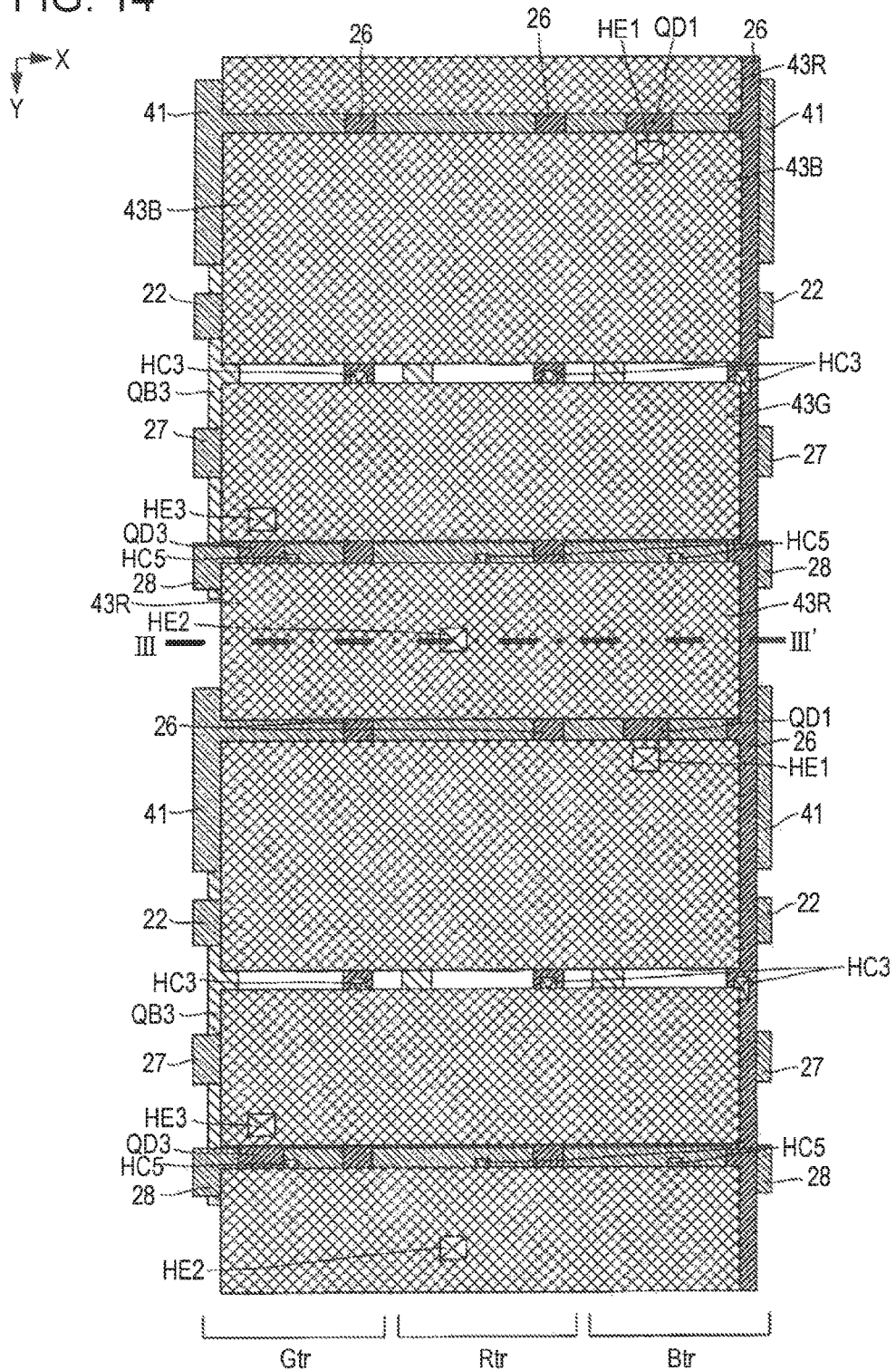
FIG. 14 is a diagram illustrating components formed on the substrate.

FIG. 13 is a diagram corresponding to FIG. 10, and FIG. 14 is a diagram corresponding to FIG. 11. As understood from FIGS. 13 and 14, the conduction hole HD1 which is a connection portion for connecting the relay electrodes QD1, QD2, and QD3 with the light-emitting control transistor Tel is disposed on the centerline III-III' of the reflective layer 43R in the row direction. With this configuration, it is possible to cause the length of the relay electrode QD1 to be equal to the length of the relay electrode QD3. As a result, it is possible to suppress variation in each subpixel. Since it is possible to minimize the lengths of the relay electrode QD1 and the relay electrode QD3, it is possible to reduce noise from the relay electrodes QD1, QD2, and QD3 in which a large current flows, and to suppress an influence on the drive transistor Tdr by the noise.

Second Exemplary Embodiment

Next, a second exemplary embodiment will be described with reference to FIGS. 15 to 20. FIGS. 15 to 20 are diagrams corresponding to FIGS. 7 to 12 in the first exemplary embodiment, respectively. Common parts with the first exemplary embodiment are denoted by the same reference signs, and descriptions thereof will be omitted.

In the first exemplary embodiment, as illustrated in FIG. 7, a configuration in which the transistors in each pixel are disposed along the column direction (Y direction) in an order of the drive transistor Tdr, the writing control transistor Twr, the compensation transistor Tcmp, and the light-emitting control transistor Tel is described.

Figure 15:
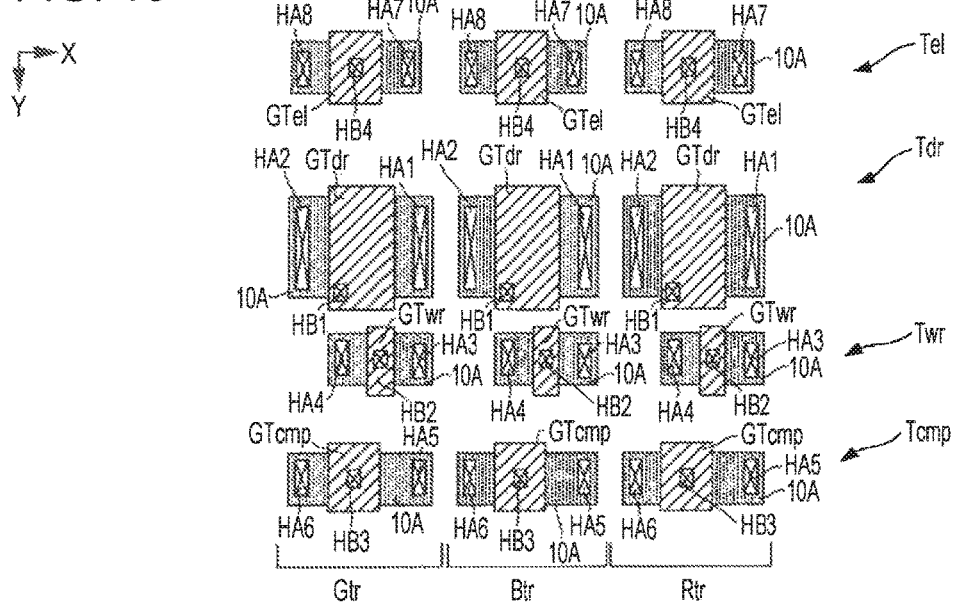
FIG. 15 is a diagram illustrating components formed on a substrate of an electro-optical device according to a second exemplary embodiment.
Figure 16:
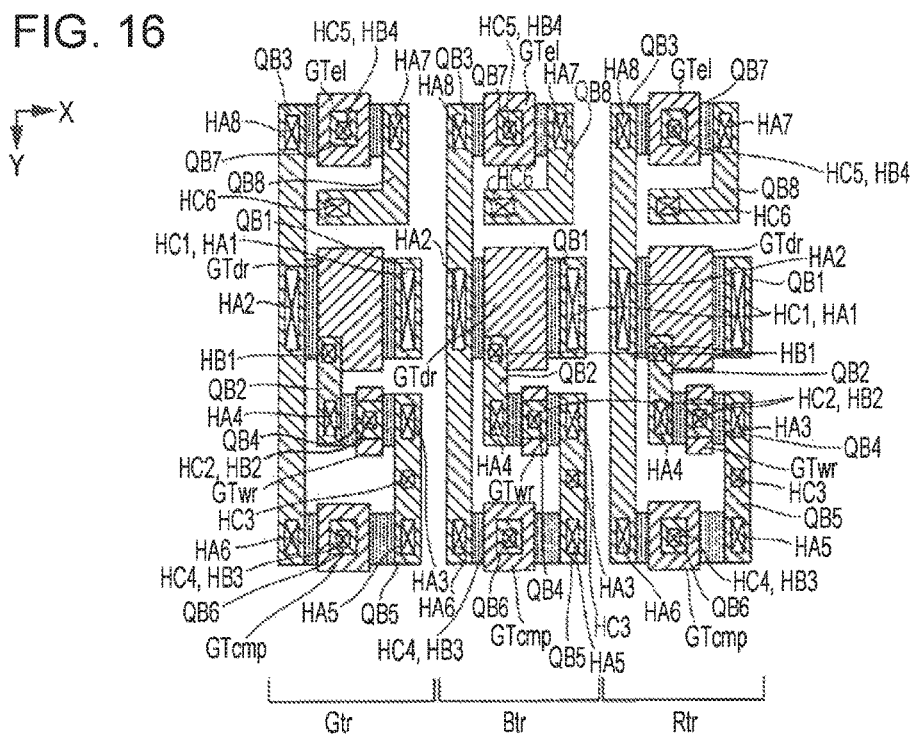
FIG. 16 is a diagram illustrating components formed on the substrate.
Figure 17:
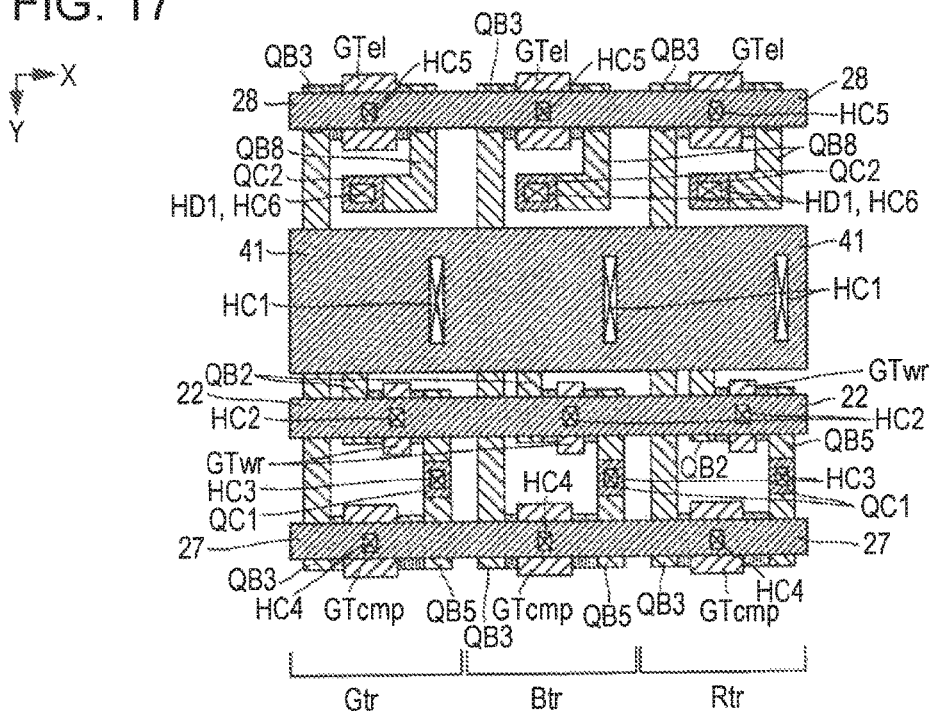
FIG. 17 is a diagram illustrating components formed on the substrate.

However, in the second exemplary embodiment, as illustrated in FIG. 15, the transistors in each pixel are disposed along the column direction (Y direction) in an order of the light-emitting control transistor Tel, the drive transistor Tdr, the writing control transistor Twr, and the compensation transistor Tcmp.

Figure 19:
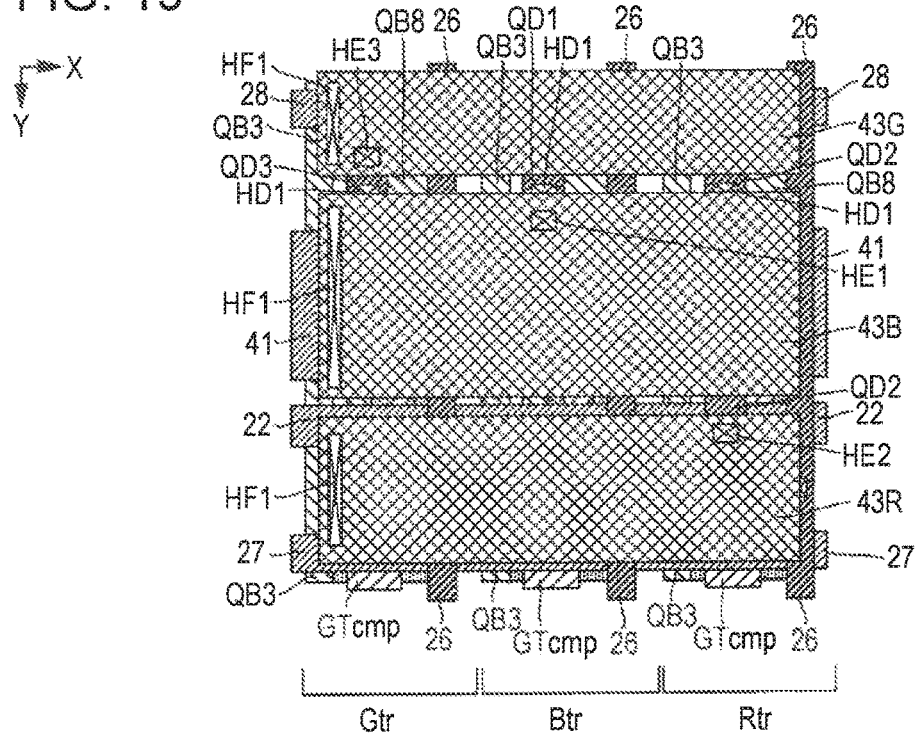
FIG. 19 is a diagram illustrating components formed on the substrate.
Figure 20:
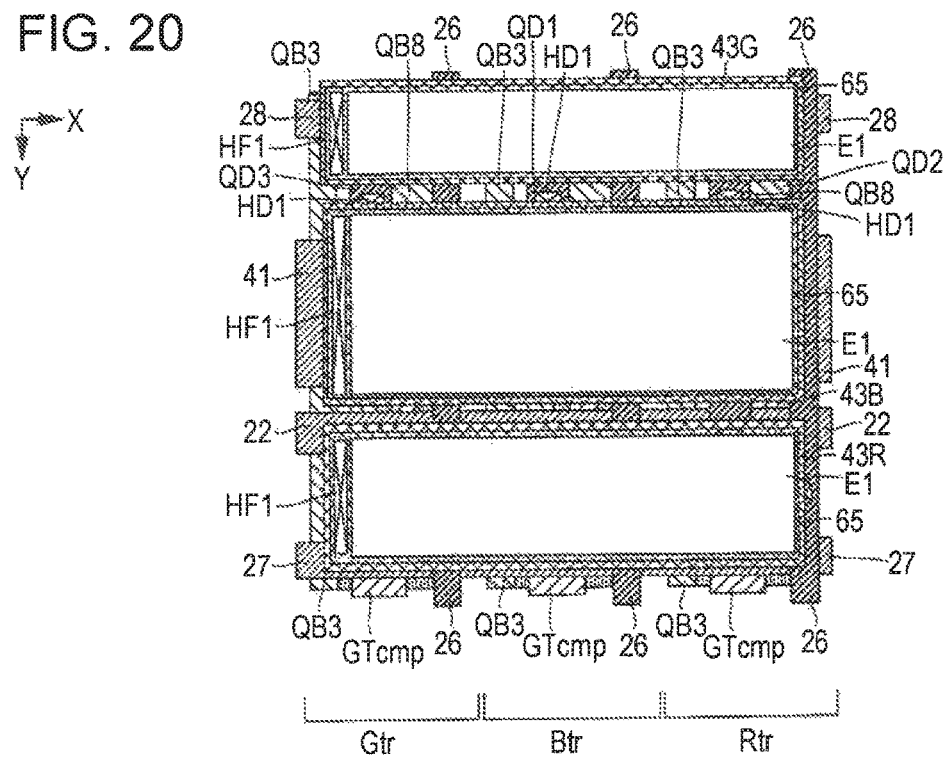
FIG. 20 is a diagram illustrating components formed on the substrate.

In the first exemplary embodiment, as illustrated in FIG. 11, the reflective layers are disposed along the column direction (Y direction) in an order of the reflective layer 43B in a subpixel of blue, the reflective layer 43G in a subpixel of green, and the reflective layer 43R in a subpixel of red. However, in the second exemplary embodiment, as illustrated in FIG. 19, the reflective layers are disposed along the column direction (Y direction) in an order of the reflective layer 43G in a subpixel of green, the reflective layer 43B in a subpixel of blue, and the reflective layer 43R in a subpixel of red.

As understood from FIGS. 15 to 20, in this exemplary embodiment, the plurality of transistors in subpixels of the colors is also disposed in the pixel circuit region of which the width in the row direction (X direction) is narrower than the width in the column direction (Y direction). Thus, the scanning lines 22 can be commonly used in the writing control transistor Twr in subpixels of the colors, and the number of scanning lines 22 selected in one horizontal scanning period is not increased. As a result, it is possible to prevent reducing of a selection time of each of the scanning lines 22 in one horizontal scanning period, and to reliably write data from the data transfer line 26 to the first electrode E1.

In this exemplary embodiment, the plurality of transistors in subpixels of the colors is also disposed in the pixel circuit region of which the width in the row direction (X direction) is narrower than the width in the column direction (Y direction), and the reflective layers 43G, 43B, and 43R in the subpixels of the colors have a width in the row direction (X direction) which is wider than the width in the column direction (Y direction). Thus, even in a case where a direction to which the main light line of the electro-optical device 1 is largely inclined is designed so as to be set as the row direction (X direction), it is possible to arrange subpixels of the same color in the row direction (X direction) of the display surface, without an increase of the number of scanning lines 22. As a result, the electro-optical device 1 in which color shift hardly occurs regarding the row direction (X direction) even though the display surface is observed at an inclined angle is provided.

In this exemplary embodiment, the reflective layers 43B, 43G, and 43R in subpixels of the colors are also disposed along the row direction (X direction), so as to overlap the transistors in the subpixels of the colors. Accordingly, it is possible to prevent irradiation of the transistor with light from the light-emitting function layer 46, and the characteristics of the transistor are not changed. In particular, the reflective layer 43B in a subpixel of blue having the largest area is disposed so as to overlap the drive transistor Tdr in subpixels of the colors. Thus, irradiation of the drive transistor Tdr with light from the light-emitting function layer 46, which influences elaborated gradation display is reliably prevented, and changing characteristics of the drive transistor Tdr is prevented. Thus, accurate gradation display is possible.

In this exemplary embodiment, areas of the reflective layers 43B, 43G, and 43R in subpixels of the colors are different from each other. The area of the reflective layer 43B in a subpixel of blue is largest, and the area of the reflective layer 43G in a subpixel of green is smaller than the area of the reflective layer 43B. Thus, the area of the reflective layer 43R in a subpixel of red is smallest.

In the exemplary embodiment, the power source wiring 41 which is disposed along the row direction (X direction) so as to overlap the drive transistor Tdr in a subpixel of each color is also provided between the reflective layer 43B in a subpixel of blue, and the transistors in a subpixel of each color. Thus, it is possible to block light from the light-emitting function layer 46 by the power source wiring 41 having an area which is relatively larger than that of other wirings, in addition to the reflective layer 43B, and to prevent irradiation of the drive transistor Tdr further more reliably. Accordingly, irradiation of the drive transistor Tdr with light from the light-emitting function layer 46, which influences elaborated gradation display is further more reliably prevented, and changing characteristics of the drive transistor Tdr is prevented. Thus, accurate gradation display is possible.

Figure 18:
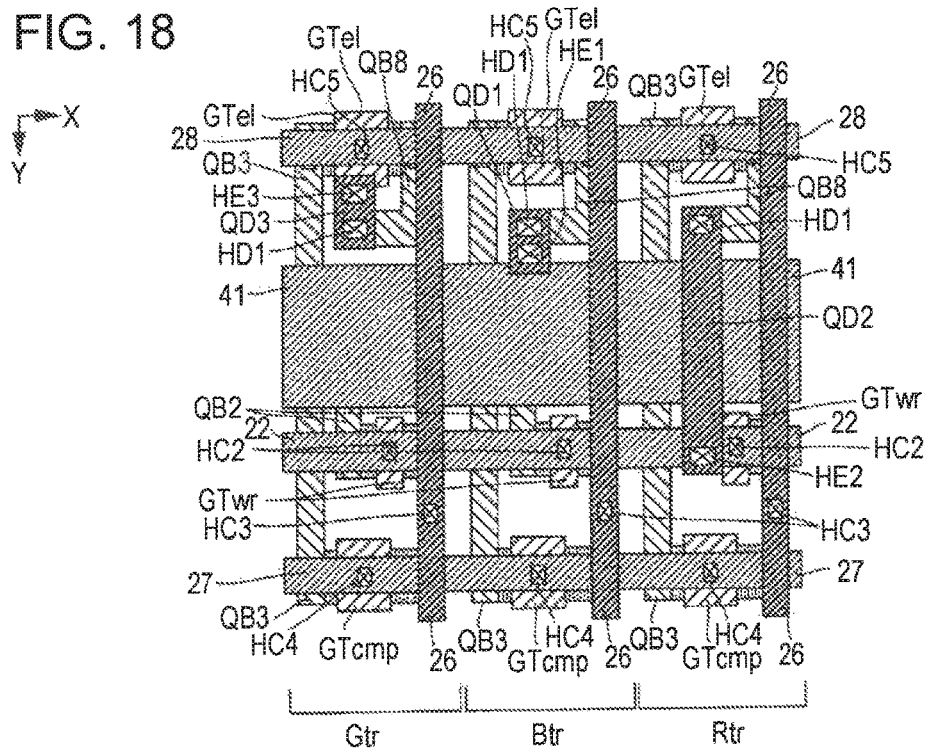
FIG. 18 is a diagram illustrating components formed on the substrate.

As understood from FIGS. 18 and 19, in this exemplary embodiment, the relay electrodes QD1, QD2, and QD3 as the fifth conductive layer which is electrically connected to the light-emitting control transistor Tel which is at least one transistor of the plurality of transistors are disposed on the layer between the layer in which the power source wiring 41 is formed, and the layer on which the reflective layers 43G 43B, and 43R are formed. Thus, noise from the relay electrodes QD1, QD2, and QD3 in which a large current flows is blocked by the power source wiring 41, and thus it is possible to suppress an influence of the noise on the drive transistor Tdr.

As understood from FIG. 19, in this exemplary embodiment, the conduction hole HD1 which is a connection portion for connecting the relay electrodes QD1, QD2, and QD3 with the light-emitting control transistor Tel is positioned on a lower layer close to the reflective layer 43G which is a reflective layer having the smallest area. With this configuration, it is also possible to reduce the length of the relay electrodes QD1, QD2, and QD3. As a result, it is possible to reduce the noise from the relay electrodes QD1, QD2, and QD3 in which a large current flows, and to suppress an influence on the drive transistor Tdr by the noise.

In this exemplary embodiment, as understood from FIG. 19, the conduction hole HD1 which is a connection portion for connecting the relay electrodes QD1, QD2, and QD3 with the light-emitting control transistor Tel is provided at a position between the reflective layer 43G and the reflective layer 43B which are adjacent to each other in the column direction. Thus, as illustrated in FIG. 18, it is possible to equalize the lengths of at least the relay electrodes QD1 and QD3. As a result, it is possible to suppress variation occurring by a difference in length of the relay electrodes, in at least adjacent subpixels.

In this exemplary embodiment, the drive transistor Tdr is disposed next to the light-emitting control transistor Tel, along the column direction (Y direction). Thus, the conduction hole HD1 which is a connection portion for connecting the relay electrodes QD1, QD2, and QD3 with the light-emitting control transistor Tel is positioned at a location other than an end portion of the plurality of transistors which are disposed along the column direction (Y direction) in the column direction (Y direction). This configuration is different from that in the first exemplary embodiment. With such a configuration, the position of the conduction hole HD1 functioning as a pixel contact portion is easily aligned to disposition of the reflective layers 43G, 43B, and 43R. As a result, in the same one pixel unit, it is possible to prevent irradiation of the drive transistor Tdr with light from the light-emitting function layer 46, by the reflective layers 43G, 43B, and 43R.

As understood from FIG. 18, in this exemplary embodiment, the relay electrodes QD1, QD2, and QD3 are also formed on the same layer as that for the data transfer line 26, and are positioned between one data transfer line 26 and another data transfer line 26 which are adjacent to each other in the row direction. Thus, a parasitic capacitance is formed between the data transfer line 26 and the relay electrodes QD1, QD2, and QD3. In order to reduce the parasitic capacitance, the relay electrodes QD1, QD2, and QD3 are preferably positioned at substantially the center between one data transfer line 26 and another data transfer line 26 which are adjacent to each other. It is possible to reduce a writing period of data into the data transfer line 26 and a writing period of data from the data transfer line 26 into the first electrode E1.

Third Exemplary Embodiment

Next, a third exemplary embodiment will be described with reference to FIGS. 21 to 28. In this exemplary embodiment, a transistor in each subpixel is configured by three transistors of a drive transistor Tdr, a light-emitting control transistor Tel, and a writing control transistor Twr.

Figure 27:
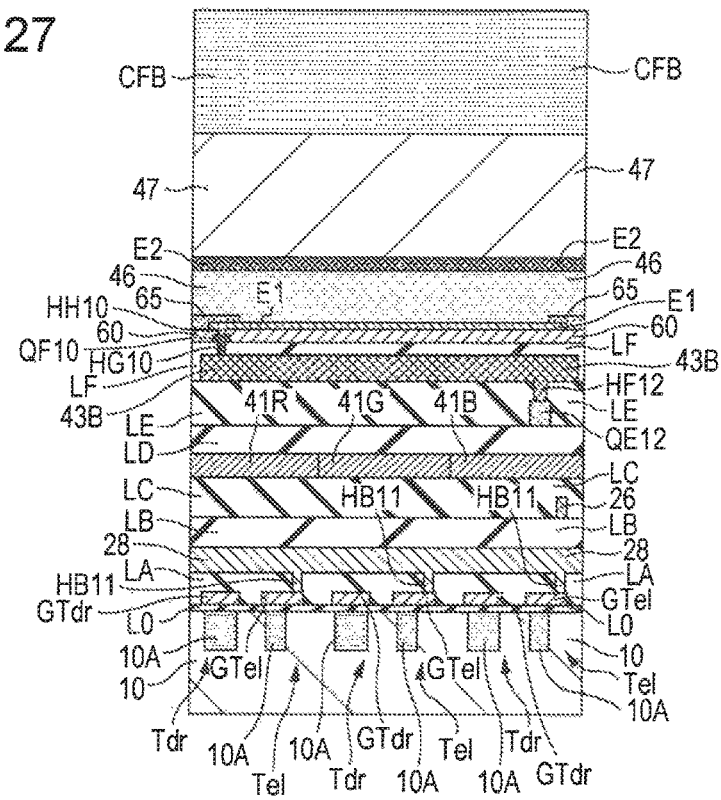
FIG. 27 is a sectional view of a pixel of one pixel unit in the row direction.
Figure 28:
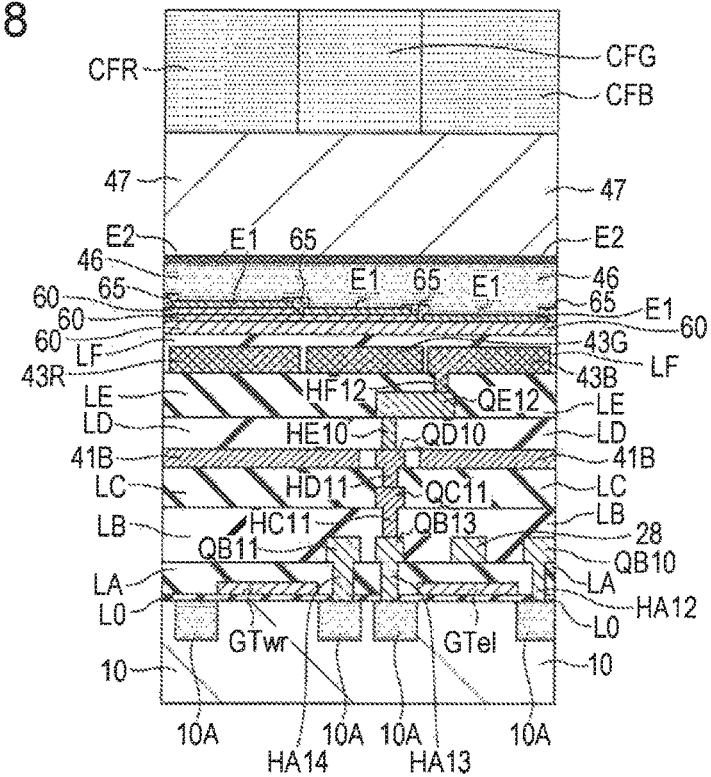
FIG. 28 is a sectional view of a subpixel in the column direction.

FIGS. 21 to 26 are plan views illustrating components formed on the substrate 10 in the electro-optical device 1 according to this exemplary embodiment. FIG. 27 is a sectional view corresponding to a section which includes XXVII-XXVII line in FIG. 26. FIG. 28 is a sectional view corresponding to a section which includes XXVIII-XXVIII line in FIG. 26. FIGS. 21 to 26 are plan views. However, from a viewpoint of easily performing visual recognition of the components, hatching having the same shape in FIGS. 27 and 28 is conveniently added to components which are common in FIGS. 27 and 28.

A rectangular region indicated by one dot chain line in FIGS. 21 to 26 represents the positions of the reflective layers in each subpixel.

Figure 21:
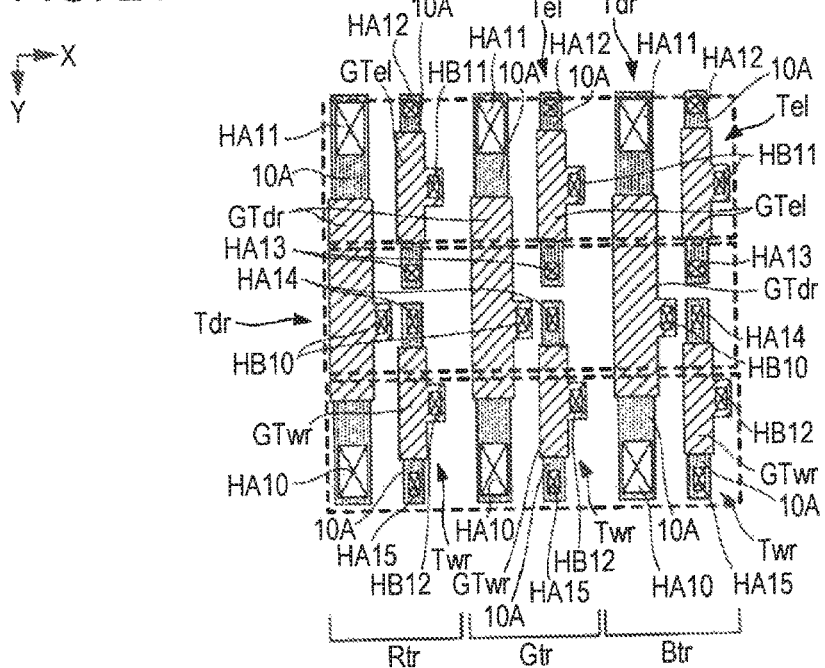
FIG. 21 is a diagram illustrating components formed on a substrate of an electro-optical device according to a third exemplary embodiment.

In this exemplary embodiment, as understood from FIG. 21, a channel length direction of the drive transistor Tdr, the light-emitting control transistor Tel, and the writing control transistor Twr in each subpixel corresponds to the column direction (Y direction). The light-emitting control transistor Tel and the writing control transistor Twr are linearly disposed so as to be in parallel.

The light-emitting control transistor Tel and the writing control transistor Twr are disposed in the row direction (X direction), regarding the drive transistor Tdr in each subpixel. However, in a case of being viewed in a subpixel unit of G (green), R (red), and B (blue), in this exemplary embodiment, the plurality of transistors in a subpixel is also disposed along the column direction (Y direction).

In this exemplary embodiment, a connection portion between the gate layers GTdr, GTwr, and GTel of the transistors, and the control line and the like is not provided at a position on a channel, but provided at a position shifted in the row direction (X direction).

As understood from FIGS. 21, 27, and 28, an active region (source/drain region) 1 OA of each of the transistors (Tdr, Twr, and Tel) in the pixel circuit 110 is formed in the surface of the substrate 10. The substrate 10 is formed of a semiconductor material such as silicon. Ions are injected to the active region 10A. An active layer of each of the transistors (Tdr, Twr, and Tel) in the pixel circuit 110 is provided between the source region and the drain region, and ions of a type different from that in the active region 10A are injected to the active layer. However, for convenience, the active layer is illustrated so as to be integrated with the active region 10A. As understood from FIGS. 21, 27, and 28, the surface of the substrate 10 in which the active region 10A is formed is covered with an insulating film (gate insulating film) L0, and gate layers GT (GTdr, GTwr, and GTel) of the transistors are formed on a surface of the insulating film L0. The gate layer GT of each of the transistors faces the active layer with the insulating film L0 interposed between the gate layer G and the active layer.

As understood from FIGS. 27 and 28, a multilayer wiring layer in which a plurality of insulating layers L (LA to LF) and a plurality of conductive layers (wiring layers) are alternately stacked is formed on the surface of the insulating film L0 on which the gate layer GT of each of the transistors is formed. Each of the insulating layers L is formed of, for example, an insulating inorganic material such as a silicon compound (typically, silicon nitride or silicon oxide). In the following descriptions, a relation in which a plurality of elements is integrally formed in the same process by selective removal of the conductive layer (single layer or plurality of layers) is described as "being formed from the same layer".

The insulating layer LA is formed on the surface of the insulating film L0 on which the gate layer GT of each of the transistors is formed. As understood from FIGS. 21, 27, and 28, the control line 28 of the light-emitting control transistor Tel, the scanning line 22, and a plurality of relay electrodes QB (QB10, QB11, QB12, QB13, and QB14) are formed on the surface of the insulating layer LA, from the same layer.

Figure 22:
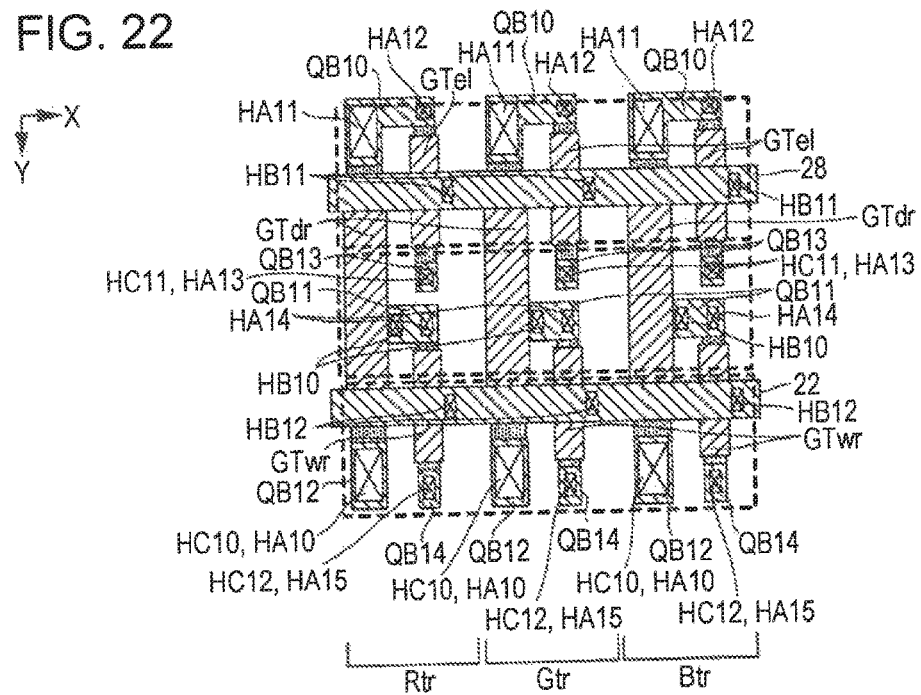
FIG. 22 is a diagram illustrating components formed on the substrate.

As understood from FIGS. 22, 27, and 28, the scanning line 22 as the first conductive layer is provided so as to be linearly extended in the row direction (X direction) over the plurality of pixel circuits 110. The scanning line 22 is conducted to the gate layer GTwr of the writing control transistor Twr in a subpixel of each color, through a conduction hole HB12 which penetrates the insulating layer LA. The scanning line 22 is electrically insulated from the data transfer line 26 which will be described later, by an insulating layer LB.

As understood from FIGS. 22, 27, and 28, the control line 28 of the light-emitting control transistor Tel is provided so as to be linearly extended in the row direction (X direction) over the plurality of pixel circuits 110. The control line 28 is conducted to the gate layer GTel of the light-emitting control transistor Tel in a subpixel of each color, through a conduction hole HB11 which penetrates the insulating layer LA. The control line 28 is electrically insulated from the data transfer line 26 which will be described later, by an insulating layer LB.

As understood from FIGS. 22, 27, and 28, the relay electrode QB10 is conducted to the active region 10A which forms a drain region or a source region of the drive transistor Tdr, through a conduction hole HA11 which penetrates the insulating film L0 and the insulating layer LA.

The relay electrode QB10 is conducted to the active region 10A which forms a drain region or a source region of the light-emitting control transistor Tel, through a conduction hole HA12 which penetrates the insulating film L0 and the insulating layer LA.

The relay electrode QB11 is conducted to the gate layer GTdr of the drive transistor Tdr through a conduction hole HB10 which penetrates the insulating layer LA. The relay electrode QB11 is conducted to the active region 10A which forms the source region or the drain region of the writing control transistor Twr, through a conduction hole HA14 which penetrates the insulating layer LA and the insulating film L0.

The relay electrode QB12 is conducted to the active region 10A which forms the drain region or the source region of the drive transistor Tdr, through a conduction hole HA10 which penetrates the insulating film L0 and the insulating layer LA.

The relay electrode QB13 is conducted to the active region 10A which forms the drain region or the source region of the drive transistor Tdr, through a conduction hole HA13 which penetrates the insulating film L0 and the insulating layer LA.

The relay electrode QB14 is conducted to the active region 10A which forms the drain region or the source region of the writing control transistor Twr, through a conduction hole HA15 which penetrates the insulating film L0 and the insulating layer LA.

Figure 23:
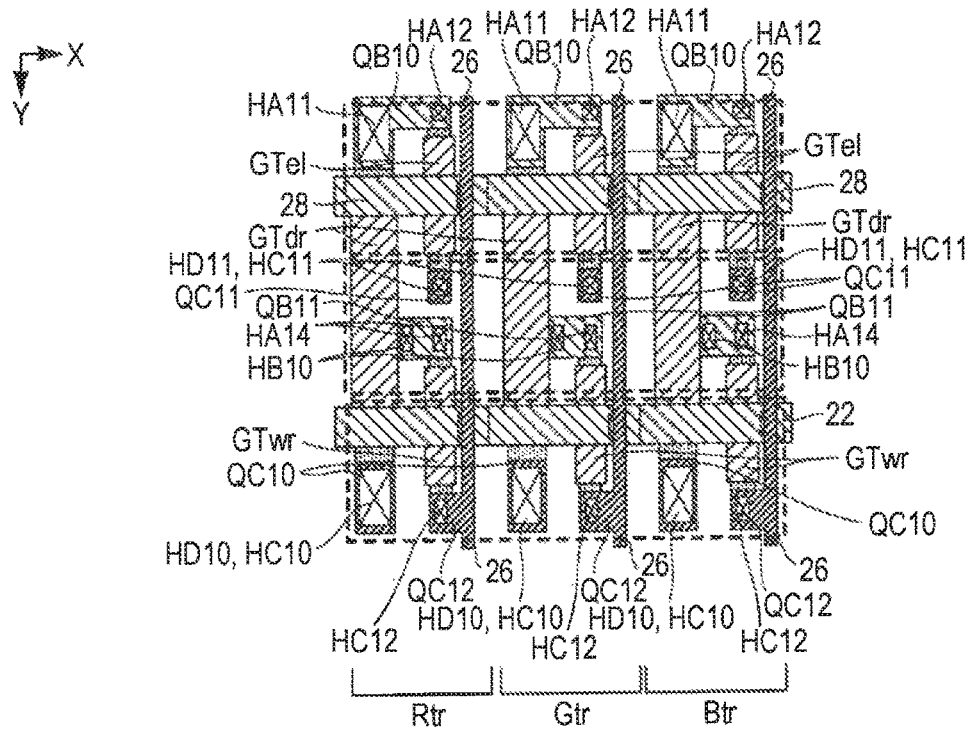
FIG. 23 is a diagram illustrating components formed on the substrate.

As understood from FIGS. 23, 27, and 28, an insulating layer LB is formed on the surface of the insulating layer LA on which the control line 28, the scanning line 22, and the plurality of relay electrodes QB (QB10, QB11, QB12, QB13, and QB14) are formed. The data transfer line 26 and a plurality of relay electrodes QC (QC10, QC11, and QC12) are formed on the surface of the insulating layer LB.

The data transfer line 26 as the second conductive layer is linearly extended in the column direction (Y direction) over the plurality of pixel circuits, and is electrically insulated from reflective layers 43B, 43G, and 43R which will be described later, by an insulating layer LC. As understood from FIG. 23, the data transfer line 26 is integrally formed with the relay electrode QC12 which is extended to the data transfer line 26 in the row direction (X direction). The relay electrode QC12 is conducted to the active region 10A which forms the drain region or the source region of the writing control transistor Twr, through a conduction hole HC12 which penetrates the insulating layer LB.

As understood from FIGS. 23, 27, and 28, the relay electrode QC10 is conducted to the relay electrode QB12 through a conduction hole HC10 which penetrates the insulating layer LB. The relay electrode QC11 is conducted to the relay electrode QB13 through a conduction hole HC11 which penetrates the insulating layer LB.

The insulating layer LC is formed on the surface of the insulating layer LB on which the data transfer line 26 and the plurality of relay electrodes QC (QC10, QC11, and QC12) are formed. As understood from FIGS. 24, 27, and 28, the power source wiring 41 as the fourth conductive layer, and a relay electrode QD10 are formed on the surface of the insulating layer LC.

The power source wiring 41 as the fourth conductive layer is electrically connected to a mount terminal (not illustrated) to which the power source potential Vel on a high potential side is supplied, through a wiring (not illustrated) in the multilayer wiring layer. The power source wiring 41 is formed in a display region (not illustrated) of the display unit 100. Although not illustrated, another power source wiring is formed in a peripheral region of the display region. This power source wiring is conducted to a mount terminal (not illustrated) to which the power source potential Vct on a low potential side is supplied, through a wiring (not illustrated) in the multilayer wiring layer. The power source wiring 41 and the power source wiring to which the power source potential Vct on the low potential side is supplied are formed by a conductive material containing, for example, silver or aluminium, and are formed so as to have a film thickness of about 100 nm, for example.

Figure 24:
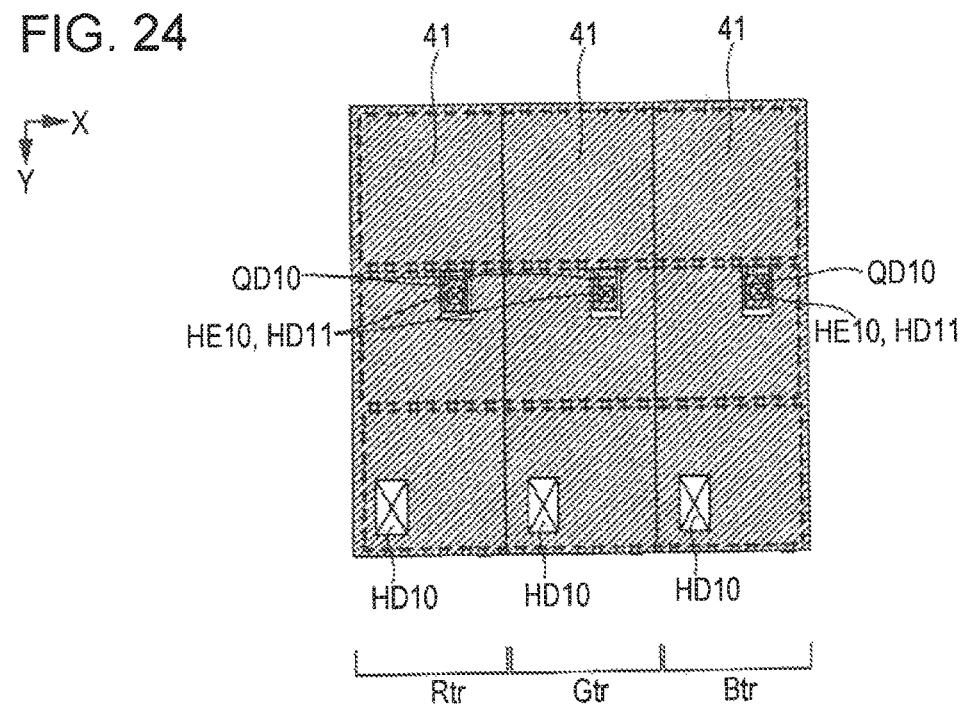
FIG. 24 is a diagram illustrating components formed on the substrate.

As understood from FIG. 24, the power source wiring 41 is formed on the entire surface except for a portion at which the relay electrode QD10 is formed. That is, the power source wiring 41 is disposed along the column direction (Y direction) for each subpixel, so as to overlap the drive transistor Tdr, the writing control transistor Twr, and the light-emitting control transistor Tel in subpixels of R (red), G (green), and B (blue), in a plan view. In the first exemplary embodiment and the second exemplary embodiment, the power source wiring 41 is disposed so as to overlap the drive transistor Tdr in a subpixel of each color. However, in this exemplary embodiment, the power source wiring 41 is disposed so as to overlap the transistors in all subpixels of each color.

The power source wiring 41 is conducted to the active region 10A which forms the drain region or the source region of the drive transistor Tdr in a subpixel of each color, through a conduction hole HD10 which penetrates the insulating layer LC.

The power source wiring 41 is electrically insulated from the data transfer line 26 by an insulating layer LC.

As illustrated in FIG. 24, an opening is formed in the power source wiring 41, in the vicinity of the center portion thereof, and the relay electrode QD10 is formed in this opening. The relay electrode QD10 is conducted to the relay electrode QC11 through a conduction hole HD11 which penetrates the insulating layer LC.

The insulating layer LD is formed on the surface of the insulating layer LC in which the power source wiring 41 and the relay electrode QD10 are formed. As understood from FIGS. 25, 27, and 28, relay electrodes QE10, QE11, and QE12 as the fifth conductive layer are formed on the surface of the insulating layer LD.

Figure 25:
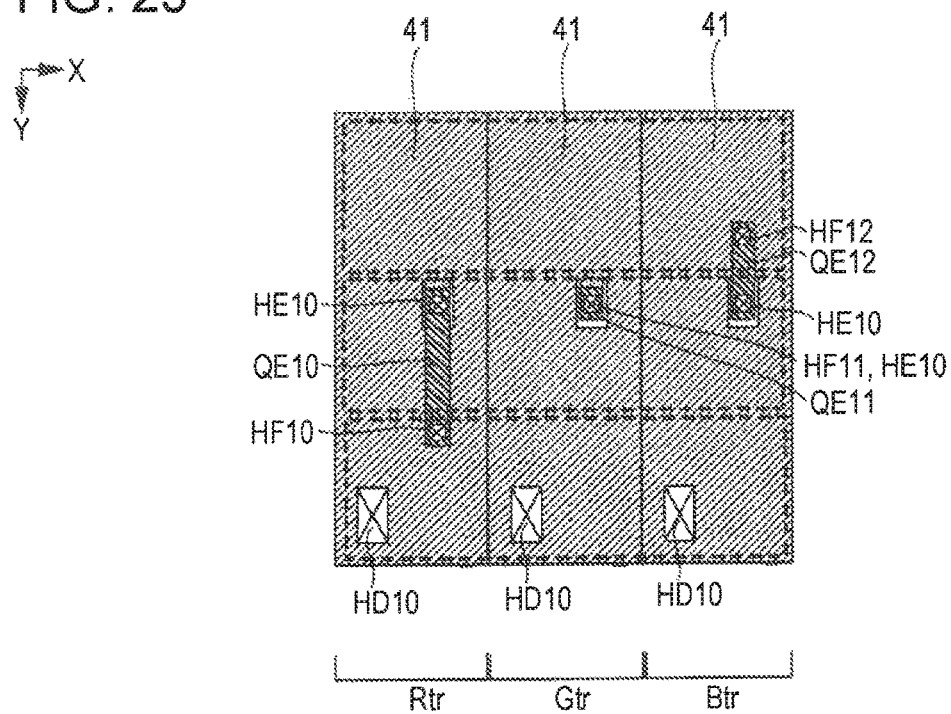
FIG. 25 is a diagram illustrating components formed on the substrate.

As understood from FIGS. 25, 27, and 28, the relay electrode QE10 is conducted to the relay electrode QD10 in a subpixel of a display color of R (red), through a conduction hole HE10 which penetrates the insulating layer LD. Thus, the relay electrode QE10 is conducted to the drain region or the source region of the light-emitting control transistor Tel in the subpixel of a display color of R (red), through the conduction hole HE10, the relay electrode QD10, the conduction hole HD11, the relay electrode QC11, the conduction hole HC11, the relay electrode QB13, and the conduction hole HA13.

As understood from FIGS. 25, 27, and 28, the relay electrode QE11 is conducted to the relay electrode QD10 in a subpixel of a display color of G (green), through the conduction hole HE10 which penetrates the insulating layer LD. Thus, the relay electrode QE11 is conducted to the drain region or the source region of the light-emitting control transistor Tel in the subpixel of a display color of G (green), through the conduction hole HE10, the relay electrode QD10, the conduction hole HD11, the relay electrode QC11, the conduction hole HC11, the relay electrode QB13, and the conduction hole HA13.

As understood from FIGS. 25, 27, and 28, the relay electrode QE12 is conducted to the relay electrode QD10 in a subpixel of a display color of B (blue), through the conduction hole HE10 which penetrates the insulating layer LD. Thus, the relay electrode QE12 is conducted to the drain region or the source region of the light-emitting control transistor Tel in the subpixel of a display color of B (blue), through the conduction hole HE10, the relay electrode QD10, the conduction hole HD11, the relay electrode QC11, the conduction hole HC11, the relay electrode QB13, and the conduction hole HA13.

The insulating layer LE is formed on the surface of the insulating layer LD on which the plurality of relay electrodes QE10, QE11, and QE12 as the fifth conductive layer are formed. As understood from FIGS. 26 to 28, the reflective layers 43B, 43G, and 43R as the third conductive layer are formed on the surface of the insulating layer LE. The reflective layer 43B is a reflective layer in a subpixel of a display color of B (blue). The reflective layer 43G is a reflective layer in a subpixel of a display color of G (green). The reflective layer 43R is a reflective layer in a subpixel of a display color of R (red).

Figure 26:
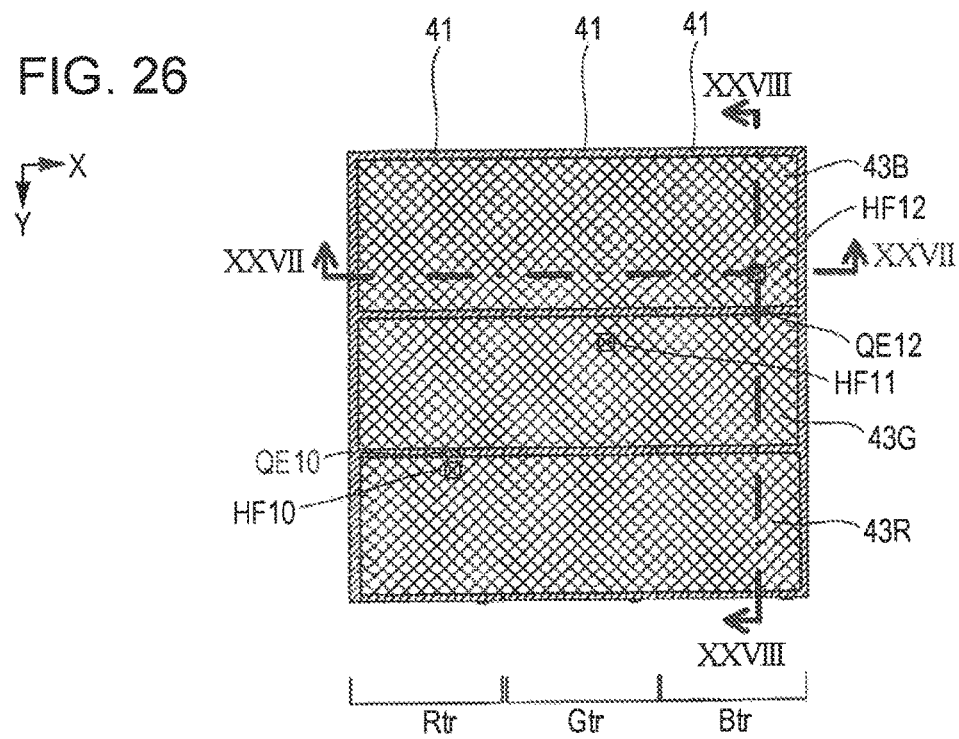
FIG. 26 is a diagram illustrating components formed on the substrate.

As understood from FIG. 26, the reflective layer 43B has a width in the row direction (X direction) which is wider than the width in the column direction (Y direction), such that the reflective layer 43B overlaps at least the drain region of the drive transistor Tdr in a subpixel of each color, in a plan view.

The reflective layer 43G has a width in the row direction (X direction) which is wider than the width in the column direction (Y direction), such that the reflective layer 430 overlaps the gate layer GTdr of the drive transistor Tdr in a subpixel of each color, in a plan view.

The reflective layer 43R has a width in the row direction (X direction) which is wider than the width in the column direction (Y direction), such that the reflective layer 43R overlaps the drain region of the drive transistor Tdr in a subpixel of each color, in a plan view.

The reflective layer 43B is conducted to the relay electrode QE12 through a conduction hole HF12 which penetrates the insulating layer LE. That is, the reflective layer 43B is conducted to the active region 10A which forms the drain region or the source region of the light-emitting control transistor Tel in a subpixel of a display color of B (blue), through the plurality of conduction holes and the plurality of relay electrodes. The plurality of conduction holes means the conduction hole HF12, the conduction hole HE10, the conduction hole HD11, the conduction hole HC11, and the conduction hole HA13. The plurality of relay electrodes means the relay electrode QE12, the relay electrode QD10, the relay electrode QC11, and the relay electrode QB13.

The reflective layer 43G is conducted to the relay electrode QE11 through a conduction hole HF11 which penetrates the insulating layer LE. That is, the reflective layer 43G is conducted to the active region 10A which forms the drain region or the source region of the light-emitting control transistor Tel in a subpixel of a display color of G (green), through the plurality of conduction holes and the plurality of relay electrodes. The plurality of conduction holes means the conduction hole HF11, the conduction hole HE10, the conduction hole HD11, the conduction hole HC11, and the conduction hole HA13. The plurality of relay electrodes means the relay electrode QE11, the relay electrode QD10, the relay electrode QC11, and the relay electrode QB13.

The reflective layer 43R is conducted to the relay electrode QE10 through a conduction hole HF10 which penetrates the insulating layer LE. That is, the reflective layer 43R is conducted to the active region 10A which forms the drain region or the source region of the light-emitting control transistor Tel in a subpixel of a display color of R (red), through the plurality of conduction holes and the plurality of relay electrodes. The plurality of conduction holes means the conduction hole HF10, the conduction hole HE10, the conduction hole HD11, the conduction hole HC11, and the conduction hole HA13. The plurality of relay electrodes means the relay electrode QE10, the relay electrode QD10, the relay electrode QC11, and the relay electrode QB13.

As illustrated in FIG. 26, in a plan view, the reflective layers are provided in an order of the reflective layers 43B, 43G, and 43R, and the plurality of transistors in subpixels of the colors which overlap the reflective layers 43B, 43G, and 43R are used as a plurality of transistors in a pixel of one pixel unit.

The reflective layers 43B, 43G, and 43R are formed by, for example, a photoreflective conductive material containing silver or aluminium, and are formed so as to have a film thickness of about 100 nm, for example. As illustrated in FIG. 26, the reflective layers 43B, 43G, and 43R are respectively disposed so as to overlap the transistors in subpixels of the colors in a plan view. Thus, there are advantages in that it is possible to prevent entering of light from the outside by the reflective layers 43B, 43G, and 43R, and to prevent current leakage of each of the transistor occurring by irradiation with light.

In this exemplary embodiment, the plurality of transistors in subpixels of the colors is disposed in the pixel circuit region of which the width in the row direction (X direction) is narrower than the width in the column direction (Y direction). However, the reflective layers 43B, 43G, and 43R in the subpixels of the colors have a width in the row direction (X direction) which is narrower than the width in the column direction (Y direction). Thus, it is possible to commonly use the scanning lines 22 in the writing control transistors Twr in subpixel of the colors, and to form the display region of the subpixel of the colors so as to have a rectangular form in the row direction (X direction).

In the exemplary embodiment, regarding the area of the reflective layer, the area of the reflective layer 43B is set to be equal to the area of the reflective layer 43R, and the area of the reflective layer 43R is set to be smallest.

The insulating layer LF is formed on the surface of the insulating layer LE in which the reflective layers 43B, 43G, and 43R are formed. As illustrated in FIG. 27, the relay electrode QF10 is formed on the surface of the insulating layer LF.

The relay electrode QF10 is conducted to the reflective layers 43B, 43G, and 43R through the conduction hole HG10 which penetrates the insulating layer LF. The relay electrode QF10 is one of relay electrodes constituting the pixel electrode conduction portion. As understood from FIGS. 21 to 28, the relay electrode QF10 is conducted to the active region 10A which forms the drain region or the source region of the light-emitting control transistor Tel, through the reflective layers 43B, 43G, and 43R, the plurality of relay electrodes, and the plurality of conduction holes.

As illustrated in FIG. 27, the optical path adjusting layer 60 is formed on the surface of the insulating layer LF on which the relay electrode QF10 is formed. The optical path adjusting layer 60 is a light-transmissive film member for defining a resonant wavelength (that is, display color) of a resonant structure of each of the pixel circuits 110. Setting is performed as follows. In pixels of which display colors are the same as each other, resonant wavelengths of resonant structures are the same as each other. In pixels of which display colors are different from each other, resonant wavelengths of resonant structures are different from each other. In the exemplary embodiment, as illustrated in FIG. 28, the optical path adjusting layer 60 is formed by three layers, in a subpixel of a display color of R (red). In a subpixel of a display color of G (green), the optical path adjusting layer 60 is formed by two layers. In a subpixel of a display color of B (blue), the optical path adjusting layer 60 is formed by one layer.

As illustrated in FIGS. 27 and 28, the first electrode E1 for each subpixel of each of the colors is formed on the surface of the optical path adjusting layer 60. The first electrode E1 is formed of, for example, a light-transmissive conductive material such as indium tin oxide (ITO). As described above with reference to FIGS. 3 and 4, the first electrode E1 is an electrode (pixel electrode) which has a substantially rectangular shape and functions as an anode of the light emitting element 45. As understood from FIG. 27, the first electrode E1 is conducted to the relay electrode QF10 through a conduction hole HH10 which is formed in the optical path adjusting layer 60. Thus, the first electrode E1 is conducted to the drain region or the source region of the light-emitting control transistor Tel through the optical path adjusting layer 60, the reflective layers 43B, 43G, and 43R, the plurality of relay electrodes, and the plurality of conduction holes.

As illustrated in FIGS. 27 and 28, the pixel definition layer 65 is formed on the surface of the optical path adjusting layer 60 on which the first electrode E1 is formed, over the entirety of the substrate 10. The pixel definition layer 65 is formed of, for example, an insulating inorganic material such as a silicon compound (typically, silicon nitride or silicon oxide). Although not illustrated, the pixel definition layer 65 causes an opening corresponding to the first electrode E1 in a subpixel of each display color to be formed.

Regarding the size of the opening, the size of an opening in a subpixel of B (blue) is equal to the size of an opening in a subpixel of R (red), and the size of an opening in a subpixel of G (green) and the size of an opening in a subpixel of R (red) are smallest. The size of the opening may be set to be different in subpixels of different display colors.

The openings are arranged at a common pitch in the column direction (Y direction), in an order of subpixels of B (blue), G (green), and R (red). Openings in subpixels of the same color are arranged at a common pitch along the row direction (X direction).

As illustrated in FIGS. 27 and 28, the light-emitting function layer 46, the second electrode E2, and a sealing member 47 are stacked on an upper layer of the first electrode E1. A sealing substrate (not illustrated) is bonded to the surface of the substrate 10 in which the above-described elements are formed, by using an adhesive. The sealing substrate is a plate-like member (for example, glass substrate) which is light-transmissive and is used for protecting the elements on the substrate 10. A color filter is formed on the surface of the sealing substrate or the surface of the sealing member 47, for each pixel circuit of a subpixel. As the color filter, a color filter CFB of B (blue), a color filter CFG of G (green), and a color filter CFR of R (red) are used.

As described above, in this exemplary embodiment, the plurality of transistors in subpixels of the colors is disposed along the column direction (Y direction). Thus, the scanning lines 22 can be commonly used in the writing control transistor Twr in subpixels of the colors, and the number of scanning lines 22 selected in one horizontal scanning period is not increased. As a result, it is possible to prevent reducing of a selection time of each of the scanning lines 22 in one horizontal scanning period, and to reliably write data from the data transfer line 26 to the first electrode E1.

In this exemplary embodiment, the plurality of transistors in subpixels of each color are disposed in the pixel circuit region of which the width in the row direction (X direction) is narrower than the width in the column direction (Y direction), and the reflective layers 43B, 43G, and 43R in the subpixels of the color have a width in the row direction (X direction) which is wider than the width in the column direction (Y direction). Thus, even in a case where a direction to which the main light line of the electro-optical device 1 is largely inclined is designed so as to be set as the row direction (X direction), it is possible to arrange subpixels of the same color in the row direction (X direction) of the display surface, without an increase of the number of scanning lines 22. As a result, the electro-optical device 1 in which color shift hardly occurs regarding the row direction (X direction) even though the display surface is observed at an inclined angle is provided.

In the exemplary embodiment, the reflective layers 43B, 43G, and 43R in subpixels of the colors are disposed along the row direction (X direction), so as to overlap the transistors in the subpixels of the colors. Accordingly, it is possible to prevent irradiation of the transistor with light from the light-emitting function layer 46, and the characteristics of the transistor are not changed. In particular, the reflective layer 43B in a subpixel of blue having the largest area is disposed so as to overlap the drain region of the drive transistor Tdr in subpixels of each color. The reflective layer 43R in a subpixel of red, which has the same area as that of the reflective layer 43B in a subpixel of blue is disposed so as to overlap the drain region of the drive transistor Tdr in subpixels of each color. The reflective layer 43G in a subpixel of green having the smallest area is disposed so as to overlap the gate layer GTdr of the drive transistor Tdr in subpixels of each color. Thus, irradiation of the drive transistor Tdr with light from the light-emitting function layer 46, which influences elaborated gradation display is reliably prevented, and changing characteristics of the drive transistor Tdr is prevented. Thus, accurate gradation display is possible.

In this exemplary embodiment, the power source wiring 41 which is disposed along the column direction (Y direction) so as to overlap a plurality of transistors in subpixels of each color is provided between the reflective layers 43B, 43G, and 43R in subpixel of colors, and the transistors in subpixels of colors. Thus, light from the light-emitting function layer 46 is completely blocked by the power source wiring 41 in addition to the reflective layers 43B, 43G, and 43R, and thus it is possible to prevent irradiation of the drive transistor Tdr further more reliably. Accordingly, irradiation of the drive transistor Tdr with light from the light-emitting function layer 46, which influences elaborated gradation display is further more reliably prevented, and changing characteristics of the drive transistor Tdr is prevented. Thus, accurate gradation display is possible.

In this exemplary embodiment, the relay electrodes QD1, QD2, and QD3 which connect the reflective layers 43B, 43G, and 43R in subpixels of the colors, with the light-emitting control transistors Tel in the subpixels of the colors are formed on a layer between a layer in which the power source wiring 41 is formed, and a layer on which the reflective layers 43B, 43G, and 43R are formed. Thus, noise from the relay electrodes QD1, QD2, and QD3 in which a large current flows is blocked by the power source wiring 41, and thus it is possible to suppress an influence of the noise on the drive transistor Tdr.

In this exemplary embodiment, the area of the reflective layer 43B is different from the areas of the reflective layers 43G and 43R. The area of the reflective layer 43B and the area of the reflective layer 43R are largest, and the area of the reflective layer 43G is smallest. That is, the areas of at least two reflective layer among the reflective layers 43B, 43G, and 43R are set to be different from each other. The relay electrodes QE12, QE11, QE10 which connect the reflective layers 43B, 43G, and 43R in subpixels of the colors, with the light-emitting control transistors Tel in the subpixels of the colors are formed on a lower layer of the reflective layer 43G having the smallest area. Thus, it is possible to reduce the length of the relay electrodes QE12, QE11, and QE10. As a result, it is possible to reduce the noise from the relay electrodes QE12, QE11, and QE10 in which a large current flows, and to suppress an influence on the drive transistor Tdr by the noise.

In this exemplary embodiment, the conduction hole HE10 which is a connection portion for connecting the relay electrodes QE12, QE11, and QE10 with the light-emitting control transistor Tel is positioned on a lower layer close to the reflective layer 43G which is a reflective layer having the smallest area, in a plan view. With this configuration, it is also possible to reduce the length of the relay electrodes QE12, QE11, and QE10. As a result, it is possible to reduce the noise from the relay electrodes QE12, QE11, and QE10 in which a large current flows, and to suppress an influence on the drive transistor Tdr by the noise.

In this exemplary embodiment, the writing control transistor Twr is disposed next to the light-emitting control transistor Tel, along the column direction (Y direction). Thus, the conduction hole HE10 which is a connection portion for connecting the relay electrodes QE12, QE11, and QE10 with the light-emitting control transistor Tel is positioned at a location other than an end portion of the plurality of transistors which are disposed along the column direction (Y direction) in the column direction (Y direction). With such a configuration, the position of the conduction hole HE10 functioning as a pixel contact portion is easily aligned to disposition of the reflective layers 43G, 43B, and 43R. As a result, in the same one pixel unit, it is possible to prevent irradiation of the drive transistor Tdr with light from the light-emitting function layer 46, by the reflective layers 43G, 43B, and 43R.

The relay electrodes QE12, QE11, and QE10 are formed on a layer different from that for the data transfer line 26. Thus, a parasitic capacitance is formed between the data transfer line 26 and another layer, particularly, the power source wiring 41. In order to reduce the parasitic capacitance, the relay electrodes QE12, QE11, and QE10 are preferably positioned at substantially the center between one data transfer line 26 and another data transfer line 26 which are adjacent to each other. It is possible to reduce a writing period of data into the data transfer line 26 and a writing period of data from the data transfer line 26 into the first electrode E1.

Modification Example

The embodiment is not limited to the above-described exemplary embodiments. For example, various modifications as will be described below can be made. The exemplary embodiments and modification examples may be appropriately combined.

(1) In the above-described exemplary embodiments, a configuration in which the optical path adjusting layer is provided between the reflective layer and the pixel electrode is described. However, the embodiment is not limited to this configuration. The optical path adjusting layer may be omitted, and a pixel electrode having reflexibility may be used. In this case, the third conductive layer may be obtained by integrally forming the reflective layer and the pixel electrode.

(2) In the above-described exemplary embodiments, a configuration in which a sealing film and the color filter are stacked on an OLED is described. However, the embodiment is not limited to this configuration. The color filter may be provided on a counter substrate.

(3) In the above-described exemplary embodiments, in a pixel of one pixel unit, the openings in subpixels of the colors are provided to be extended in the row direction (X direction), and openings in subpixels of the same color are arranged at a common pitch in the row direction (X direction), over pixels of a plurality of one pixel units. In the pixel of one pixel unit, the openings are arranged so as to cause the widths of the openings in subpixels of the colors in the row direction (X direction) to be equal to each other. That is, the reflective layers in subpixels of the colors are arranged along the row direction (X direction), so as to overlap at least one transistor in the subpixels of the colors.

However, the embodiment is not limited to such a configuration. For example, the reflective layer in a subpixel of at least one color may be disposed along the row direction (X direction), so as to overlap at least one transistor in the subpixels of the colors. In this case, reflective layers in subpixels of other colors are arranged so as to overlap at least one transistor in a subpixels of at least one color, and reflective layers in subpixels of different colors are arranged along the row direction (X direction).

For example, the opening in a subpixel of blue may be extended in the row direction (X direction) over an inside of the pixel of one pixel unit, and thus the width of the opening in the row direction (X direction) may be largest. The opening in a subpixel of red and the opening in a subpixel of green may be arranged in parallel to the row direction (X direction) in the pixel of one pixel unit.

(4) In the above-described exemplary embodiments, the power source wiring is disposed between the reflective layer and the drive transistor. However, a metal wire other than the power source wiring may be disposed. The metal wiring is disposed between the reflective layer and the drive transistor, and thus it is possible to reliably block light applied to the drive transistor.

(5) In the above-described exemplary embodiments, an OLED is employed as an example of an electro-optical material. However, the embodiment is also applied to an electro-optical device using an electro-optical material other than the OLED. The electro-optical material is a material of which optical characteristics such as transmittance or luminance are changed by supplying an electrical signal (current signal or voltage signal). For example, the embodiment may be also applied to a display panel using a light emitting element of liquid crystal, inorganic EL, light-emitting polymer, or the like, similarly to the exemplary embodiments. Similarly to the exemplary embodiments, the embodiment may be also applied to an electrophoresis display panel which uses a microcapsule as the electro-optical material. The microcapsule contains a colored liquid, and white particles dispersed in the liquid. Similarly to the exemplary embodiments, the embodiment may be also applied to a twist ball display panel which uses a twist ball as the electro-optical material. The twist ball is separately coated with different colors for each region which has a different polarity. Similarly to the exemplary embodiments, the embodiment may be also applied to various electro-optical devices such as a toner display panel and a plasma display panel. The toner display panel uses a black toner as the electro-optical material. The plasma display panel uses high pressure gases of helium, neon, or the like, as the electro-optical material.

Application Example

Figure 29:
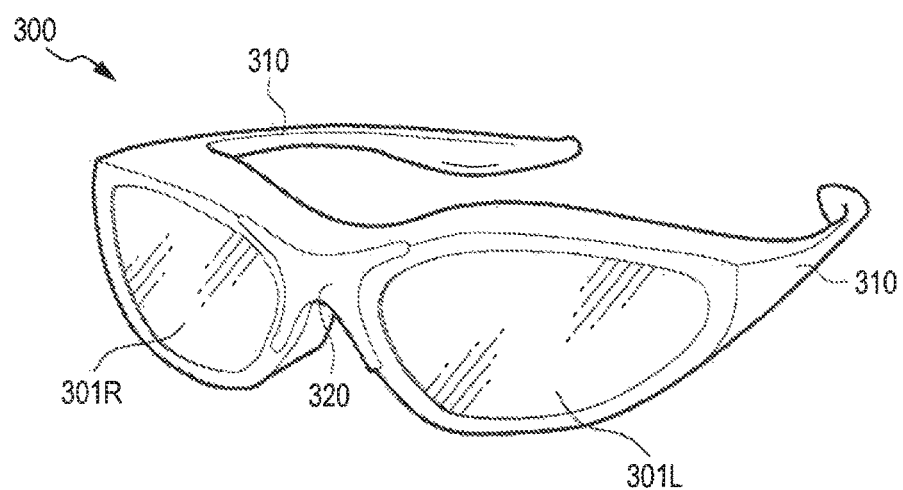
FIG. 29 is a diagram illustrating an example of an electronic apparatus.
Figure 30:
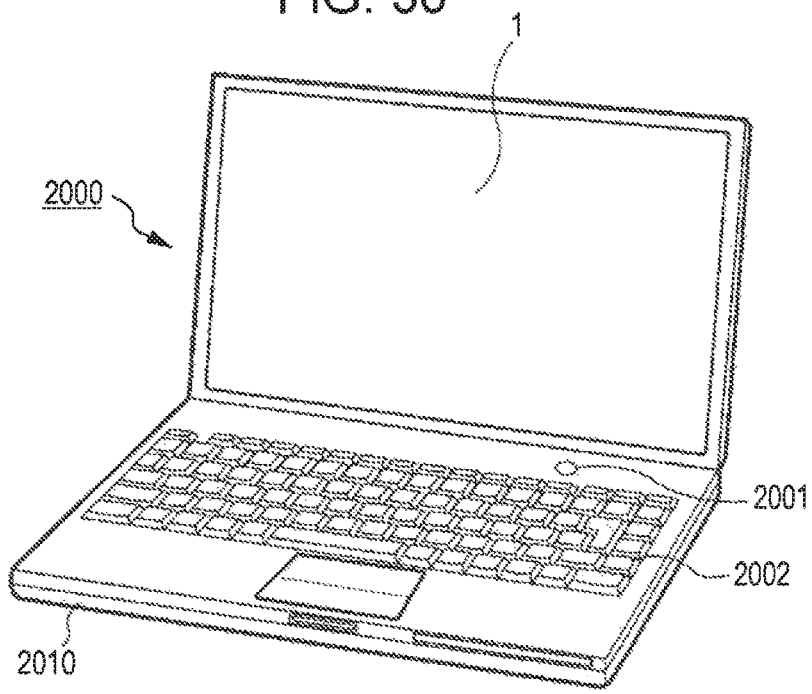
FIG. 30 is a diagram illustrating another example of the electronic apparatus.
Figure 31:
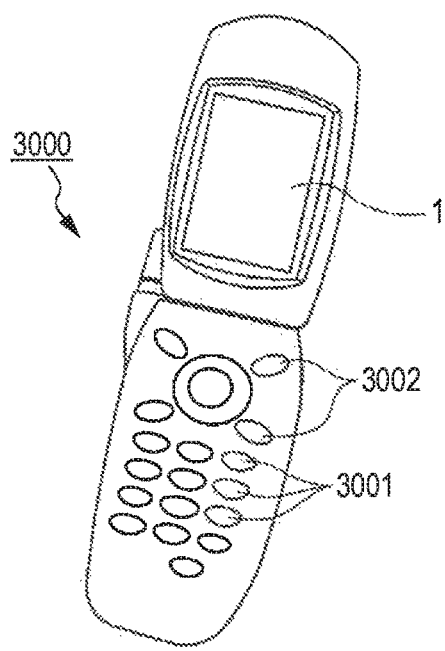
FIG. 31 is a diagram illustrating still another example of the electronic apparatus.

The embodiment may be used in various electronic apparatus. FIGS. 29 to 31 illustrate specific forms of an electronic apparatus which is an application target for the embodiment.

FIG. 29 is a perspective view illustrating an appearance of a head mounted display as an electronic apparatus which employs the electro-optical device according to the embodiment. As illustrated in FIG. 29, a head mounted display 300 includes a temple 310 which is similar to general glasses, a bridge 320, and projection optical systems 301L and 301R, in appearance. Although illustrations are omitted, an electro-optical device 1 for a left eye, and an electro-optical device 1 for a right eye are provided on a depth side of the projection optical systems 301L and 301R, which is near to the bridge 320.

FIG. 30 is a perspective view of a portable type personal computer which employs the electro-optical device. A personal computer 2000 includes the electro-optical device 1 that displays various images, and a main body portion 2010 in which a power switch 2001 and a keyboard 2002 are installed.

FIG. 31 is a perspective view illustrating a portable telephone. A portable telephone 3000 includes various operation buttons 3001, a scroll button 3002, and the electro-optical device 1 that displays various images. The scroll button 3002 is operated, and thus a screen displayed in the electro-optical device 1 is scrolled. The embodiment can be also applied to such a portable telephone.

Examples of the electronic apparatus to which the embodiment is applied include a personal digital assistant (PDA) in addition to the devices illustrated in FIGS. 29 to 31. In addition, a digital still camera, a TV, a video camera, a car navigation device, an in-vehicle indicator (instrument panel), an electronic note, electronic paper, an electronic calculator, a word processor, a work station, a picture phone, and a POS terminal are exemplified. Further, devices including a printer, a scanner, a copier, a video player, and a touch panel are exemplified.

The entire disclosure of Japanese Patent Application No. 2016-026379, filed Feb. 15, 2016 is expressly incorporated by reference herein.

What is claimed is:

1. An electro-optical device comprising:
a plurality of first conductive layers each of which is extended in a first direction;
a plurality of second conductive layers each of which is extended in a second direction which intersects with the first direction; and
a plurality of subpixels each of which is arranged to corresponding intersection between the plurality of first conductive layers and the plurality of second conductive layers, each of the plurality of subpixels comprising:

a third conductive layer of a light emitting element;
a plurality of transistors;
a fourth conductive layer which is disposed so as to overlap at least one transistor of the plurality of transistors; and
a fifth conductive layer which is electrically connected to at least one transistor of the plurality of transistors, and is disposed on a layer between the third conductive layer and the fourth conductive layer,
wherein the plurality of transistors is disposed in a pixel circuit region of which a width in the first direction is narrower than a width in the second direction,
one conductive layer among the plurality of first conductive layers is electrically connected to transistors which are at least one of the plurality of transistors included in each of two subpixels which are adjacent to each other in the first direction among the plurality of subpixels, and
the third conductive layer of at least one subpixel of the plurality of subpixels has a width in the first direction, which is wider than a width in the second direction, and overlaps the fourth conductive layer and at least one transistor of the plurality of transistors in the at least one subpixel.

2. The electro-optical device according to claim 1, wherein
the plurality of first conductive layers is scanning lines.

3. The electro-optical device according to claim 1, wherein
a transistor which overlaps the third conductive layer and the fourth conductive layer among the plurality of transistors is a drive transistor.

4. The electro-optical device according to claim 3, wherein
the fourth conductive layer is a power source wiring which is connected to the drive transistor.

5. The electro-optical device according to claim 1, wherein
the fourth conductive layer is a power source wiring which is extended in the first direction.

6. The electro-optical device according to claim 1, wherein
areas of third conductive layers in at least two subpixels of the plurality of subpixels are different from each other, and
the fifth conductive layer in each of the at least two subpixels is disposed so as to overlap the third conductive layer having a smallest area among the third conductive layers in the at least two subpixels.

7. The electro-optical device according to claim 1, wherein
a connection portion in one subpixel of the plurality of subpixels electrically connects the fifth conductive layer in the one subpixel to at least one transistor of the plurality of transistors in the one subpixel, the connection portion is positioned between the third conductive layer in the one subpixel and a third conductive layer in another subpixel which is adjacent to the one subpixel in the first direction.

8. The electro-optical device according to claim 6, wherein
each of connection portions in the at least two subpixels electrically connects the fifth conductive layer to corresponding at least one transistor of the plurality of transistors, the connection portions are positioned on a centerline of the third conductive layer having the smallest area, in the first direction.

9. The electro-optical device according to claim 6, wherein
each of connection portions in the at least two subpixels electrically connects the fifth conductive layer to corresponding at least one transistor of the plurality of transistors, the connection portions are disposed so as to overlap the third conductive layer having the smallest area, in a plan view.

10. The electro-optical device according to claim 1, wherein
a connection portion in one subpixel of the plurality of subpixels electrically connects the fifth conductive layer in the one subpixel to at least one transistor of the plurality of transistors in the one subpixel, the connection portion is positioned at a location other than an end portion of the plurality of transistors in the one subpixel in the second direction.

11. The electro-optical device according to claim 1, wherein
the fifth conductive layer in one subpixel of the plurality of subpixels is formed on the same layer as the plurality of second conductive layers, the fifth conductive layer in the one subpixel is positioned between one second conductive layer which corresponds to the one subpixel and another second conductive layer which corresponds to other subpixel adjacent to the one subpixel in the first direction.

12. The electro-optical device according to claim 1, wherein
the fifth conductive layer is formed on a layer which is different from the plurality of second conductive layers.

13. The electro-optical device according to claim 1, wherein
subpixels of the plurality of subpixels which are adjacent to each other in the first direction, and have different display colors is set as one pixel unit.

14. An electronic apparatus comprising:
the electro-optical device according to claim 1.

15. An electronic apparatus comprising:
the electro-optical device according to claim 2.

16. An electronic apparatus comprising:
the electro-optical device according to claim 3.

17. An electronic apparatus comprising:
the electro-optical device according to claim 4.

18. An electronic apparatus comprising:
the electro-optical device according to claim 5.

19. An electronic apparatus comprising:
the electro-optical device according to claim 6.

20. An electronic apparatus comprising:
the electro-optical device according to claim 7.

* * * * *